(12) United States Patent
Han et al.

(10) Patent No.: US 11,056,188 B2
(45) Date of Patent: Jul. 6, 2021

(54) THREE DIMENSIONAL NONVOLATILE MEMORY DEVICE INCLUDING CHANNEL STRUCTURE AND RESISTANCE CHANGE MEMORY LAYER

(71) Applicant: SK hynix Inc., Icheon-si (KR)

(72) Inventors: Jae Hyun Han, Icheon-si (KR); Hyangkeun Yoo, Seongnam-si (KR); Se Ho Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/844,662

(22) Filed: Apr. 9, 2020

(65) Prior Publication Data

US 2021/0074354 A1    Mar. 11, 2021

(30) Foreign Application Priority Data

Sep. 6, 2019    (KR) ................... 10-2019-0111073

(51) Int. Cl.
*H01L 27/24*    (2006.01)
*G11C 13/00*    (2006.01)
*H01L 45/00*    (2006.01)

(52) U.S. Cl.
CPC ...... *G11C 13/0011* (2013.01); *G11C 13/0004* (2013.01); *H01L 27/249* (2013.01); *H01L 45/06* (2013.01); *H01L 45/1253* (2013.01); *H01L 45/145* (2013.01)

(58) Field of Classification Search
CPC ............ G11C 13/0011; G11C 13/0026; G11C 13/0028; G11C 13/0004; G11C 13/0069; G11C 2013/0045; G11C 2013/0078; H01L 45/06; H01L 27/249; H01L 45/1253; H01L 45/145
See application file for complete search history.

(56) References Cited

U.S. PATENT DOCUMENTS

| | | | |
|---|---|---|---|
| 8,953,361 B2* | 2/2015 | Park | G11C 13/0002 365/148 |
| 9,269,425 B2* | 2/2016 | Lan | G11C 13/004 |
| 9,595,568 B2* | 3/2017 | Mine | H01L 45/16 |
| 9,691,819 B2 | 6/2017 | Oh et al. | |
| 9,859,338 B2 | 1/2018 | Chen et al. | |
| 2013/0328005 A1* | 12/2013 | Shin | H01L 27/2436 257/1 |
| 2014/0145137 A1* | 5/2014 | Ju | H01L 27/2454 257/2 |
| 2015/0249093 A1* | 9/2015 | Lee | H01L 27/11582 257/324 |
| 2017/0271402 A1* | 9/2017 | Chen | H01L 27/2454 |
| 2021/0074763 A1* | 3/2021 | Han | H01L 45/146 |

* cited by examiner

*Primary Examiner* — Mushfique Siddique

(57) ABSTRACT

A nonvolatile memory device includes a substrate, a source electrode structure disposed on the substrate, a channel structure disposed to be contact a sidewall surface of the source electrode structure, a resistance change memory layer disposed on a sidewall surface of the channel structure, a drain electrode structure disposed to contact the resistance change memory layer, a plurality of gate dielectric structures extending in the first direction and disposed to be spaced apart from each other in a second direction, and a plurality of gate electrode structures disposed to extend in the first direction in the plurality of the gate dielectric structure.

22 Claims, 14 Drawing Sheets

US 11,056,188 B2

THREE DIMENSIONAL NONVOLATILE MEMORY DEVICE INCLUDING CHANNEL STRUCTURE AND RESISTANCE CHANGE MEMORY LAYER

CROSS-REFERENCE TO RELATED APPLICATION

The present application claims priority under 35 U.S.C. § 119(a) to Korean Patent Application No. 10-2019-0111073, filed on Sep. 6, 2019, which is herein incorporated by reference in its entirety.

BACKGROUND

1. Technical Field

The present disclosure relates generally to a nonvolatile memory device and, more particularly, to a nonvolatile memory device having a resistance change memory layer.

2. Related Art

As the design rule decreases and the degree of integration increases, research has continued on the structures of semiconductor devices that can guarantee both structural stability and operational reliability. Currently, as a charge storage structure, a nonvolatile memory device, such as a flash memory that employs a three-layer stacked structure including a charge tunneling layer, a charge trap layer, and a charge barrier layer, has been widely utilized.

Recently, various nonvolatile memory devices having different structures from existing flash memories have been proposed. An example of a nonvolatile memory device is a resistance change memory device. While a flash memory implements a memory function through charge storage, recently in other configurations, predetermined signal information can be written by varying resistance in a memory layer between a high resistance and a low resistance, and storing the changed resistance in a nonvolatile manner.

SUMMARY

A nonvolatile memory device according to an aspect includes a substrate, and a source electrode structure disposed on the substrate. The source electrode structure includes a plurality of source electrode layer patterns and a plurality of source insulation layer patterns that are alternately stacked in a first direction perpendicular to the substrate, and the source electrode structure extends in a second direction perpendicular to the first direction. The nonvolatile memory device includes a channel structure disposed on the substrate and disposed to contact a sidewall surface of the source electrode structure. Here, the sidewall surface of the source electrode structure is a plane formed by the first and second directions. In addition, the nonvolatile memory device includes a resistance change memory layer disposed on a sidewall surface of the channel structure on the substrate. Here, the sidewall surface of the channel structure is a plane formed by the first and second directions. The nonvolatile memory device includes a drain electrode structure disposed to contact the resistance change memory layer on the substrate. The drain electrode structure includes a plurality of drain electrode layer patterns and a plurality of drain insulation layer patterns that are alternately disposed in the first direction, and the drain electrode structure extends in the second direction. The nonvolatile memory device includes a plurality of gate dielectric structures extending in the first direction and disposed to be spaced apart from each other along the second direction, and a plurality of gate electrode structures disposed to extend in the first direction in the gate dielectric structure.

A nonvolatile memory device according to another aspect includes a substrate, and a global source line disposed on the substrate. The global source line includes a plurality of source electrode layer patterns spaced apart from each other in a first direction perpendicular to the substrate, and the plurality of source electrode layer patterns extend in a second direction perpendicular to the first direction. The nonvolatile memory device includes a channel structure disposed on the substrate to contact the global source line in a third direction perpendicular to the first and second directions, and a resistance change memory layer disposed to contact a sidewall surface of the channel structure in the third direction. The nonvolatile memory device includes a global drain line disposed to contact the resistance change memory layer in the third direction on the substrate. The global drain line includes a plurality of drain electrode layer patterns disposed to be spaced apart from each other in the first direction, and the plurality of drain electrode layer patterns extend in the second direction. The nonvolatile memory device includes a plurality of gate dielectric structures extending in the first direction in the channel structure and disposed to be spaced apart from each other in the second direction, and a plurality of gate electrode structures disposed to extend in the first direction in the gate dielectric structures. The channel structure is separated from one of the plurality of gate electrode structures by one of the plurality of the gate dielectric structures.

DETAILED DESCRIPTION

Figure 1:
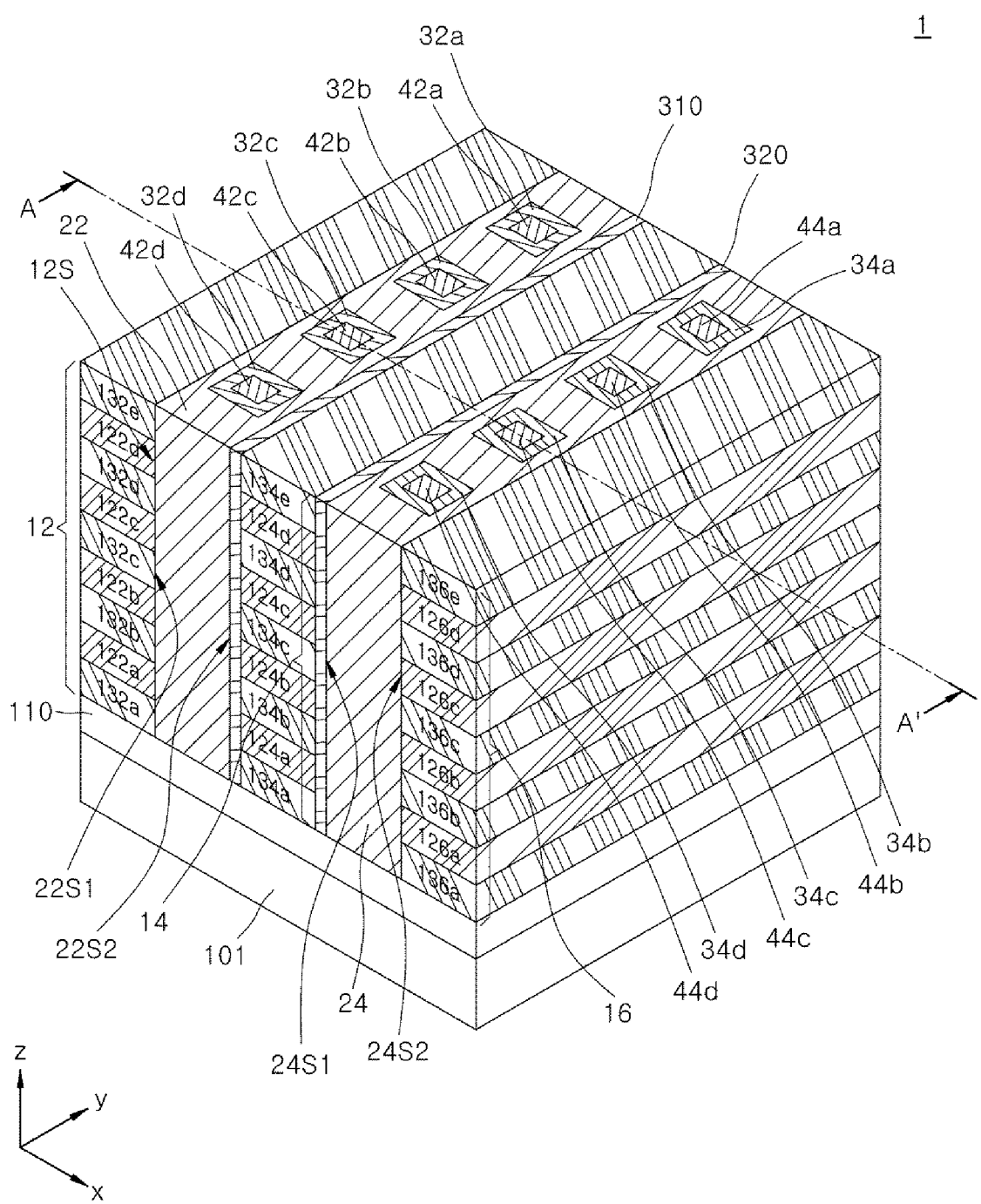
FIG. 1 is a perspective view schematically illustrating a nonvolatile memory device according to an embodiment of the present disclosure.

Various embodiments will now be described hereinafter with reference to the accompanying drawings. In the drawings, the dimensions of layers and regions may be exaggerated for clarity of illustration. As a whole, the drawings are described from an observer's viewpoint. If an element is referred to be located "on" or "under" another element, it may be understood that the element is directly located "on" or "under" the other element, or an additional element may be interposed between the element and the other element. The same reference numerals in the drawings refer to substantially the same elements as each other.

The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a component, a part, or combinations thereof, but not used to preclude the presence or possibility of addition one or more other features, numbers, steps, operations, elements, components, parts, or combinations thereof.

Herein, the x-direction means a direction parallel to the x-axis in the x-y-z coordinate system. Similarly, the y-direction means a direction parallel to the y-axis in the x-y-z coordinate system, and the z-direction means a direction parallel to the z-axis in the x-y-z coordinate system.

Figure 2:
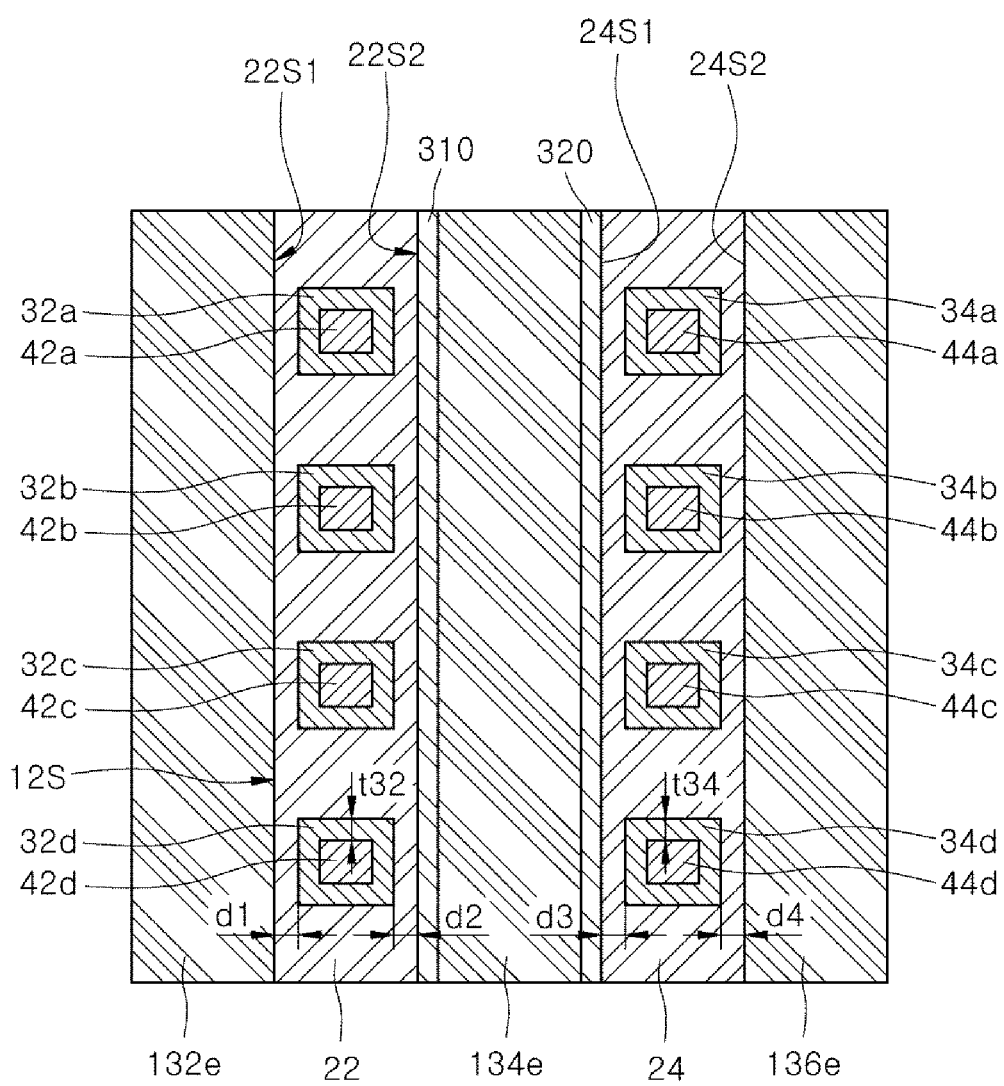
FIG. 2 is a plan view of the nonvolatile memory device of FIG. 1.
Figure 3:
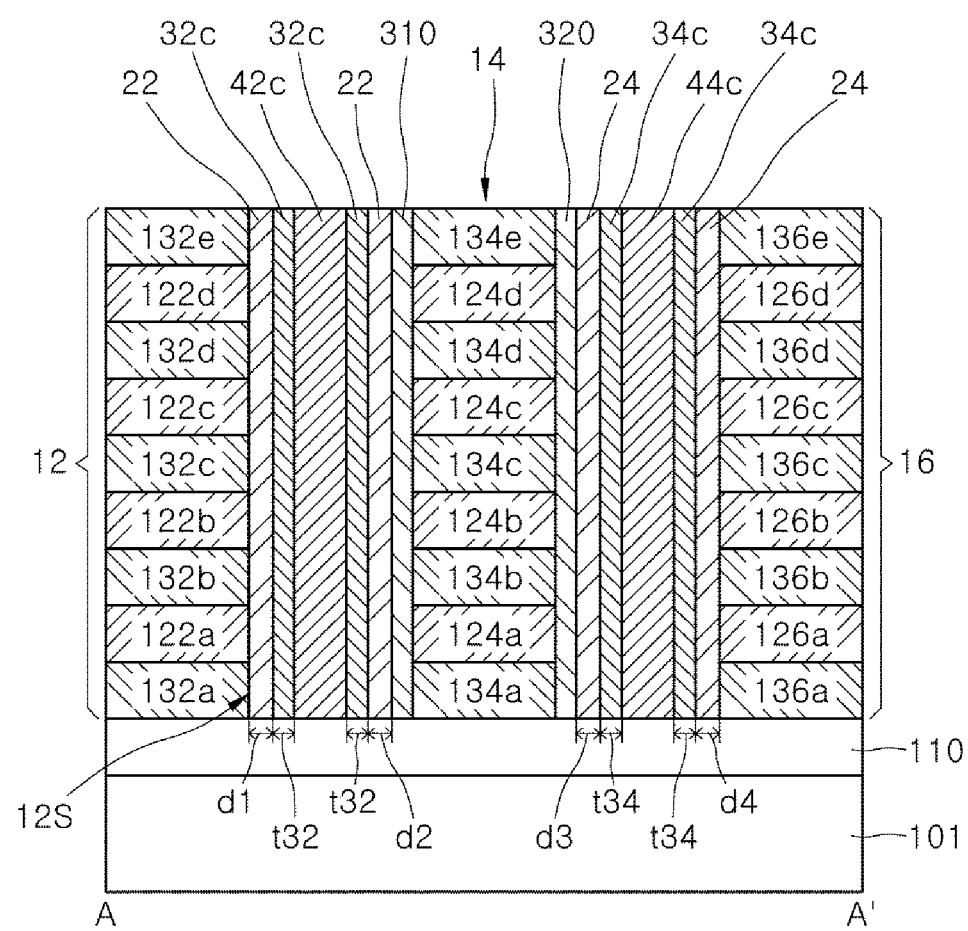
FIG. 3 is a cross-sectional view taken along the line A-A' of the nonvolatile memory device of FIG. 1.

FIG. 1 is a perspective view schematically illustrating a nonvolatile memory device according to an embodiment of the present disclosure. FIG. 2 is a plan view of the nonvolatile memory device of FIG. 1. FIG. 3 is a cross-sectional view taken along the line A-A' of the nonvolatile memory device of FIG. 1.

Referring to FIGS. 1 to 3, a nonvolatile memory device 1 may include a substrate 101, first and second source electrode structures 12 and 16, first and second channel structures 22 and 24, first to eighth gate dielectric structures 32a, 32b, 32c, 32d, 34a, 34b, 34c, and 34d, first to eighth gate electrode structures 42a, 42b, 42c, 42d, 44a, 44b, 44c, and 44d, first and second resistance change memory layers 310 and 320, and a drain electrode structure 14. In an embodiment, the first and second source electrode structures 12 and 16, the first and second channel structures 22 and 24, the first and second resistance change memory layers 310 and 320, and the drain electrode structure 14 may be sequentially disposed on the substrate 101 in an x-direction, and may extend in a y-direction, as illustrated in FIG. 1. In FIGS. 1 to 3, although four gate dielectric structures 32a, 32b, 32c, and 32d and four gate electrode structures 42a, 42b, 42c, and 42d are arranged in the first channel structure 22 in the y-direction, the number of gate dielectric structures and gate electrode structures are not necessarily limited to four, and other various numbers are possible. Similarly, although four gate dielectric structures 34a, 34b, 34c, and 34d and four gate electrode structures 44a, 44b, 44c, and 44d are arranged in the second channel structure 24 in the y-direction, the number of gate dielectric structures and gate electrode structures are not necessarily limited to four, but other various numbers are possible.

The substrate 101 may include a semiconductor material. Specifically, the semiconductor material may include silicon (Si), germanium (Ge), gallium arsenide (GaAs), or the like. The substrate 101 may be doped with an n-type or a p-type dopant. For example, the substrate 101 may include a well region doped with an n-type or a p-type dopant.

A base insulation layer 110 may be disposed on the substrate 101. The base insulation layer 110 may electrically insulate the first and second source electrode structures 12 and 16; the first and second channel structures 22 and 24; the first to eighth gate dielectric structures 32a, 32b, 32c, 32d, 34a, 34b, 34c, and 34d; the first to eighth gate electrode structures 42a, 42b, 42c, 42d, 44a, 44b, 44c, and 44d; the first and second resistance change memory layers 310 and 320; and the drain electrode structure 14, from the substrate 101.

Although not illustrated in FIG. 1, at least one conductive layer and at least one insulation layer may be disposed between the substrate 101 and the base insulation layer 110. The conductive layer and the insulation layer may form various circuit patterns. That is, the conductive layer and the insulation layer may form a plurality of wirings, or may compose of passive elements such as a capacitor or a resistor, or active elements such as a diode or a transistor, by way of non-limiting examples.

Referring to FIG. 1, the first source electrode structure 12 may be disposed on the base insulation layer 110. The first source electrode structure 12 may include first to fourth source electrode layer patterns 122a, 122b, 122c and 122d and first to fifth source insulation layer patterns 132a, 132b, 132c, 132d and 132e, which are alternately stacked on the base insulation layer 110 in a first direction (i.e., the z-direction) perpendicular to the substrate 101. Here, the first source electrode structure 12 may extend in a second direction (i.e., the y-direction) perpendicular to the first direction. The first to fourth source electrode layer patterns 122a, 122b, 122c and 122d may be electrically insulated from each other by the first to fifth source insulation layer patterns 132a, 132b, 132c, 132d and 132e with respect to the first direction (i.e., the z-direction). The first to fourth source electrode layer patterns 122a, 122b, 122c and 122d may be conductive lines extending in the second direction (i.e., the y-direction). Each of the first to fourth source electrode layer patterns 122a, 122b, 122c and 122d may be independently maintained a predetermined potential.

In an embodiment, the first to fourth source electrode layer patterns 122a, 122b, 122c and 122d may each include a conductive material. The conductive material may include, for example, doped semiconductor, metal, conductive metal silicide, conductive metal nitride, conductive metal oxide, of the like. The first to fifth source insulation layer patterns 132a, 132b, 132c, 132d and 132e may each include an insulative material. The insulative material may include, for example, oxide, nitride, oxynitride, or similar materials.

Referring to FIGS. 1 and 3, the first channel structure 22 may be disposed on the base insulation layer 110. The first channel structure 22 may have a predetermined height along the first direction (i.e., the z-direction), have a predetermined length along the second direction (i.e., the y-direction), and have a predetermined width along the third direction (i.e., the x-direction).

In an embodiment, the first channel structure 22 may be disposed to contact a sidewall surface 12S of the first source electrode structure 12. Viewed in the x-direction, the first channel structure 22 may extend in the second direction (i.e., the y-direction), and may be disposed to cover or be co-extensive with a sidewall surface of the first source electrode structure 12, which includes the first to fourth source electrode layer patterns 122a, 122b, 122c, and 122d and the first to fifth source insulation layer patterns 132a, 132b, 132c, 132d, and 132e.

The first channel structure 22 may include first to fourth gate dielectric structures 32a, 32b, 32c, and 32d and first to fourth gate electrode structures 42a, 42b, 42c, and 42d. That is, the first channel structure 22 may be disposed to surround or envelope outer sidewalls of the first to fourth gate dielectric structures 32a, 32b, 32c, and 32d, which in turn may surround sidewalls of the first to fourth gate electrode structures 42a, 42b, 42c, and 42d.

The first channel structure 22 may include doped semiconductor material, metal oxide, transition metal di-chalcogenide (TMDC), or a combination of two or more thereof. The semiconductor material may include, for example, silicon (Si), germanium (Ge), gallium arsenide (GaAs), or the like. The metal oxide may include indium-gallium-zinc oxide, for example. In an embodiment, the first channel structure 22 may include silicon (Si) doped with an n-type dopant. Alternatively, the first channel structure 22 may include c-axis aligned indium-gallium-zinc oxide. The transition metal di-chalcogenide (TMDC) may include, for example, molybdenum disulfide (MoS2), molybdenum diselenide (MoSe2) molybdenum telluride (MoTe2), tungsten disulfide (WS2), tungsten diselenide (WSe2), or similar materials.

The first to fourth gate dielectric structures 32a, 32b, 32c, and 32d may be disposed in the first channel structure 22. The first to fourth gate dielectric structures 32a, 32b, 32c, and 32d may each be disposed on the base insulation layer 110 and extend in a pillar-like shape in the first direction (i.e., the z-direction). In addition, the first to fourth gate electrode structures 42a, 42b, 42c, and 42d may be disposed in the corresponding first to fourth gate dielectric structures 32a, 32b, 32c, and 32d, respectively. The first to fourth gate electrode structures 42a, 42b, 42c, and 42d may be disposed on the base insulation layer 110 to extend in the first direction (i.e., the z-direction). The first to fourth gate electrode structures 42a, 42b, 42c, and 42d may each have a pillar-like shape. Thus, as illustrated in FIG. 2, each of the first to fourth gate dielectric structures 32a, 32b, 32c, and 32d may surround or envelop outer surfaces of each of the first to fourth gate electrode structures 42a, 42b, 42c, and 42d by a predetermined thickness t32. Similarly, the first channel structure 22 may surround or envelope the first to fourth gate dielectric structures 32a, 32b, 32c, and 32d, which in turn surround or envelope and the first to fourth gate electrode structures 42a, 42b, 42c, and 42d, respectively.

Referring to FIG. 2, the first to fourth gate dielectric structures 32a, 32b, 32c, and 32d may be disposed to be spaced apart from a first sidewall surface 22S1 of the first channel structure 22 in the third direction (i.e., the x-direction) by a first distance d1, and may be disposed to be spaced apart from a second sidewall surface 22S2 of the first channel structure 22 in the third direction (i.e., the x-direction) by a second distance d2. In other words, the first to fourth gate dielectric structures 32a, 32b, 32c, and 32d may be disposed to be spaced apart from the first source electrode structure 12 and the first resistance change memory layer 310 in the third direction (i.e., the x-direction), by the first distance d1 and the second distance d2. The first to fourth gate dielectric structures 32a, 32b, 32c, and 32d may each include, for example, silicon oxide, silicon nitride, silicon oxynitride, aluminum oxide, hafnium oxide, zirconium oxide, or the like.

The first to fourth gate electrode structures 42a, 42b, 42c, and 42d may be separated from the first channel structure 22 by the first to fourth gate dielectric structures 32a, 32b, 32c, and 32d. The first to fourth gate electrode structures 42a, 42b, 42c, and 42d may each include a conductive material. The conductive material may include metal, conductive metal nitride, conductive metal carbide, conductive metal silicide, or conductive metal oxide, as non-limiting examples. The conductive material may include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 1 to 3, the first resistance change memory layer 310 may be disposed on the second sidewall surface 22S2 of the first channel structure 22. As illustrated, the second sidewall surface 22S2 may be a plane formed by a first direction (i.e., a z-direction) and a second direction (i.e., a y-direction). The first resistance change memory layer 310 may be disposed to have a predetermined thickness in the third direction (i.e., the x-direction).

An internal resistance of the first resistance change memory layer 310 may be variably changed when a voltage of a threshold voltage or higher, or a current of a threshold current or higher, is applied from outside. The variably changed internal resistance may be maintained even after the voltage or current is removed from the first resistance change memory layer 310, so that the internal resistance may be stored in the first resistance change memory layer 310 as signal information in a nonvolatile manner. In an embodiment, first, when a gate voltage of a threshold voltage or higher is applied to the first to fourth gate electrode structures 42a, 42b, 42c, and 42d, a channel layer may be formed in the first channel structure 22. More specifically, the channel layer may be formed in the channel structure 22 adjacent to the first to fourth gate dielectric structures 32a, 32b, 32c, and 32d that respectively correspond to the first to fourth gate electrode structures 42a, 42b, 42c, and 42d. Then, after the channel layer is formed, when a voltage is applied between the first to fourth source electrode layer patterns 122a, 122b, 122c, and 122d of the first source electrode structure 12 and the first to fourth drain electrode layer patterns 124a, 124b, 124c, and 124d of the drain electrode structure 14, that voltage may be mostly applied to the first resistance change memory layer 310 in the x-direction. Thus, the internal resistance of the first resistance change memory layer 310 may vary according to the magnitude and polarity of an externally applied voltage.

In an embodiment, the first resistance change memory layer 310 may include oxide having oxygen vacancies. For example, the oxide may include silicon oxide, aluminum oxide, tantalum oxide, titanium oxide, hafnium oxide, or a combination of two or more thereof.

Referring to FIGS. 1 to 3, the drain electrode structure 14 may be disposed on the base insulation layer 110 and contact the first resistance change memory layer 310. The drain electrode structure 14 may include first to fourth drain electrode layer patterns 124*a*, 124*b*, 124*c*, and 124*d* and first to fifth drain insulation layer patterns 134*a*, 134*b*, 134*c*, 134*d*, and 134*e*, which are alternately stacked in the first direction (i.e., the z-direction). Here, the drain electrode structure 14 may extend in the second direction (i.e., the y-direction).

The first to fourth drain electrode layer patterns 124*a*, 124*b*, 124*c*, and 124*d* may be electrically insulated from each other by the first to fifth drain insulation layer patterns 134*a*, 134*b*, 134*c*, 134*d*, and 134*e*. The first to fourth drain electrode layer patterns 124*a*, 124*b*, 124*c*, and 124*d* may be conductive lines extending in the second direction (i.e., the y-direction). The first to fourth drain electrode layer patterns 124*a*, 124*b*, 124*c*, and 124*d* may each maintain a predetermined potential. In an embodiment, during a write operation or a read operation into the first resistance change memory layer 310 of the nonvolatile memory device 1, the potential of the first to fourth drain electrode layer patterns 124*a*, 124*b*, 124*c*, and 124*d* may be different from the potential of the first to fourth source electrode layer patterns 122*a*, 122*b*, 122*c*, and 122*d* of the first source electrode structure 12. During a write operation or a read operation into the second resistance change memory layer 320 of the nonvolatile memory device 1, the potential of the first to fourth drain electrode layer patterns 124*a*, 124*b*, 124*c*, and 124*d* may be different from the potential of the first to fourth source electrode layer patterns 126*a*, 126*b*, 126*c*, and 126*d* of the second source electrode structure 16.

In an embodiment, the first to fourth source electrode layer patterns 122*a*, 122*b*, 122*c*, and 122*d* and the first to fourth drain electrode layer patterns 124*a*, 124*b*, 124*c*, and 124*d* may be disposed at positions corresponding to each other on the same or substantially the same horizontal plane. For example, the first source electrode layer pattern 122*a* and the first drain electrode layer pattern 124*a* may be disposed opposite to each other, and at substantially the same vertical location on either side of the first channel structure 22. In the same manner, the second to fourth source electrode layer patterns 122*b*, 122*c* and 122*d* and the second to fourth drain electrode layer patterns 124*b*, 124*c* and 124*d* may be disposed at the same level on opposite sides of the first channel structure 22, respectively.

In an embodiment, the first to fourth drain electrode layer patterns 124*a*, 124*b*, 124*c*, and 124*d* may each include a conductive material. The conductive material may include doped semiconductor, metal, conductive metal silicide, conductive metal nitride, conductive metal oxide or the like. The first to fifth drain insulation layer patterns 134*a*, 134*b*, 134*c*, 134*d*, and 134*e* may each include an insulative material. The insulative material may include, for example oxide, nitride, oxynitride, or the like.

Referring to FIGS. 1 to 3, the second resistance change memory layer 320 may be disposed on a sidewall surface of the drain electrode structure 14 opposite to the sidewall surface in contact with first resistance change memory layer 310. The second resistance change memory layer 320 may be disposed, on the base insulation layer 110, in a manner similar to the first resistance change memory layer 310, with the drain electrode structure 14 interposed therebetween.

An internal resistance of the second resistance change memory layer 320 may be variably changed when a voltage of a threshold voltage or higher, or a current of a threshold current or higher, is applied from outside. The variably changed internal resistance may be maintained even after the voltage or current is removed from the second resistance change memory layer 320, so that the internal resistance may be stored in the second resistance change memory layer 320 as signal information in a nonvolatile manner. In an embodiment, the internal resistance of the second resistance change memory layer 320 may be variably changed according to a voltage or a current applied between the first to fourth source electrode layer patterns 126*a*, 126*b*, 126*c*, and 126*d* of the second source electrode structure 16 and the first to fourth drain electrode layer patterns 124*a*, 124*b*, 124*c*, and 124*d* of the drain electrode structure 14, based on a channel layer formed in the second channel structure 24, as described below. The channel layer may be formed in the second channel structure 24 adjacent to the corresponding fifth to eighth gate dielectric structures 34*a*, 34*b*, 34*c*, and 34*d* when a voltage of a threshold voltage or higher is applied to the fifth to eighth gate electrode structures 44*a*, 44*b*, 44*c*, and 44*d*. A configuration of the second resistance change memory layer 320 may be substantially the same as a configuration of the first resistance change memory layer 310.

Referring to FIGS. 1 to 3, the second channel structure 24 may be disposed on the base insulation layer 110 and contact the second resistance change memory layer 320 at a first sidewall surface 24S1.

The second channel structure 24 may include the fifth to eighth gate dielectric structures 34*a*, 34*b*, 34*c*, and 34*d* and the fifth to eighth gate electrode structures 44*a*, 44*b*, 44*c*, and 44*d*. That is, the second channel structure 24 may surround or envelop outer surfaces of each of the fifth to eighth gate dielectric structures 34*a*, 34*b*, 34*c*, and 34*d*, which in turn surrounds or envelops the fifth to eighth gate electrode structures 44*a*, 44*b*, 44*c*, and 44*d*, respectively. A configuration of the second channel structure 24 may be substantially the same as the configuration of the first channel structure 22.

The fifth to eighth gate dielectric structures 34*a*, 34*b*, 34*c*, and 34*d* may each be disposed on the base insulation layer 110, and extend in a pillar shape extending in the first direction (i.e., the z-direction). The fifth to eighth gate electrode structures 44*a*, 44*b*, 44*c*, and 44*d* may each be disposed on the base insulation layer 110 and extend in the first direction (i.e., the z-direction). In addition, in a plan view, the fifth to eighth gate electrode structures 44*a*, 44*b*, 44*c*, and 44*d* may be disposed in and fill the area within the fifth to eighth gate dielectric structures 34*a*, 34*b*, 34*c*, and 34*d*. Thus, as illustrated in FIG. 2, the fifth to eighth gate dielectric structures 34*a*, 34*b*, 34*c*, and 34*d* may be disposed to surround the fifth to eighth gate electrode structures 44*a*, 44*b*, 44*c*, and 44*d* by a predetermined thickness t34.

Referring to FIG. 2, the fifth to eighth gate dielectric structures 34*a*, 34*b*, 34*c* and 34*d* may be disposed to be spaced apart from a first sidewall surface 24S1 of the second channel structure 24 in the third direction (i.e., the x-direction) by a first distance d3, and disposed to be spaced apart from a second sidewall surface 24S2 of the second channel structure 24 in the third direction (i.e., the x-direction) by a second distance d4. In other words, the fifth to eighth gate dielectric structures 34*a*, 34*b*, 34*c* and 34*d* may be disposed do be spaced apart from the second resistance change memory layer 320, and the second source electrode structure 16, in the third direction (i.e., the x-direction) by the first distance d3 and second distance d4, respectively. A configuration of the fifth to eighth gate dielectric structures 34*a*, 34*b*, 34*c* and 34*d* may be substantially the same as the configuration of the first to fourth gate dielectric structures 32*a*, 32*b*, 32*c* and 32*d*.

The fifth to eighth gate electrode structures 44*a*, 44*b*, 44*c* and 44*d* may be separated from the second channel structure 24 by the fifth to eighth gate dielectric structures 34a, 34b, 34c and 34d. A configuration of the fifth to eighth gate electrode structures 44a, 44b, 44c and 44d may be substantially the same as the configuration of the first to fourth gate electrode structures 42a, 42b, 42c and 42d.

Referring to FIGS. 1 to 3, the second source electrode structure 16 may be disposed on the base insulation layer 110 and contact the second sidewall surface 24S2 of the second channel structure 24. The second source electrode structure 16 may include first to fourth source electrode layer patterns 126a, 126b, 126c and 126d and first to fifth source insulation layer patterns 136a, 136b, 136c, 136d and 136e, which are alternately stacked along the first direction (i.e., the z-direction). The second source electrode structure 16 may extend in the second direction (i.e., the y-direction) perpendicular to the first direction.

The first to fourth source electrode layer patterns 126a, 126b, 126c and 126d may be electrically insulated from each other by the first to fifth source insulation layer patterns 136a, 136b, 136c, 136d and 136e. The first to fourth source electrode layer patterns 126a, 126b, 126c and 126d may be conductive lines extending in the second direction (i.e., the y-direction). The first to fourth source electrode layer patterns 126a, 126b, 126c and 126d may each maintain a predetermined potential.

In an embodiment, configurations of the first to fourth source electrode layer patterns 126a, 126b, 126c and 126d of the second electrode source structure 16 may be substantially the same as the configurations of the first to fourth source electrode layer patterns 122a, 122b, 122c and 122d of the first source electrode structure 12. In addition, configurations of the first to fifth source insulation layer patterns 136a, 136b, 136c, 136d and 136e of the second source electrode structure 16 may be substantially the same as the configurations of the first to fifth source insulation layer patterns 132a, 132b, 132c, 132d and 132e of the first source electrode structure 12.

Referring to FIGS. 1 to 3, the first and second resistance change memory layers 310 and 320, the first and second channel structures 22 and 24, and the first and second source electrode structures 12 and 16 may each be symmetrically disposed around a y-z plane centered on drain electrode structure 14. Similarly, the first to fourth gate dielectric structures 32a, 32b, 32c, and 32d and the fifth to eighth gate dielectric structures 34a, 34b, 34c, and 34d may be symmetrically disposed around an y-z plane centered on the drain electrode structure 14, respectively. In addition, the first to fourth gate electrode structures 42a, 42b, 42c and 42d and the fifth to eighth gate electrode structures 44a, 44b, 44c and 44d may be symmetrically disposed around an y-z plane centered on the drain electrode structure 14, respectively.

Referring to FIGS. 1 and 2, the first to fourth gate dielectric structures 32a, 32b, 32c, 32d and fifth to eight gate dielectric structures 34a, 34b, 34c and 34d and the first to fourth gate electrode structures 42a, 42b, 42c, 42d and fifth to eighth gate electrode structures 44a, 44b, 44c and 44d may be arranged in the second direction (i.e., the y-direction) in first and second channel structures 22 and 24, respectively. The first and second resistance change memory layers 310 and 320, the first and second source electrode structures 12 and 16, and the drain electrode structure 14 may extend in the second direction (i.e., the y-direction) to cover or to be co-extensive with the first to fourth gate dielectric structures 32a, 32b, 32c, 32d and fifth to eight gate dielectric structures 34a, 34b, 34c and 34d and the first to fourth gate electrode structures 42a, 42b, 42c, 42d and fifth to eighth gate electrode structures 44a, 44b, 44c and 44d, respectively.

In some other embodiments, the number of the source electrode layer patterns of the first and second source electrode structures 12 and 16 and the number of the drain electrode layer patterns of the drain electrode structure 14 are not necessarily limited to four, and other various numbers are possible. In addition, the number of the source insulation layer patterns of the first and second source electrode structures 12 and 16 and the number of the drain insulation layer patterns of the drain electrode structure 14 are not necessarily limited to five, and other various numbers are possible. Similarly, the number of the gate dielectric structures and the gate electrode structures inside the first and second resistance change structures 22 and 24, respectively, is not necessarily limited to four, but various other numbers are possible.

Figure 4:
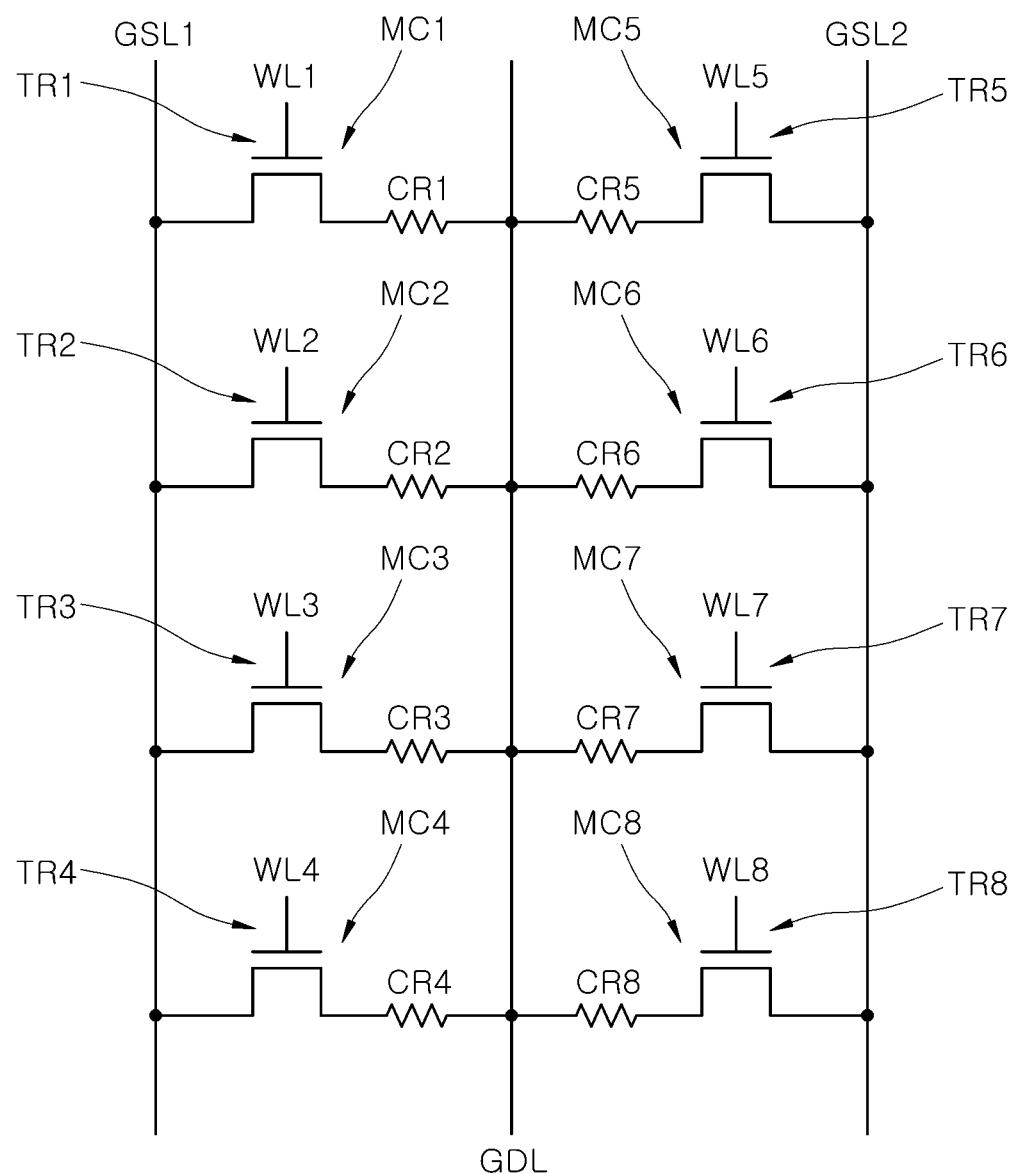
FIG. 4 is a schematic circuit diagram of a nonvolatile memory device according to an embodiment of the present disclosure.

FIG. 4 is a schematic circuit diagram of a nonvolatile memory device according to an embodiment of the present disclosure. The circuit diagram of FIG. 4 may correspond to a portion of the configuration of the nonvolatile memory device 1 described above with reference to FIGS. 1 to 3.

Referring to FIG. 4, there is disclosed first to eighth memory cells MC1, MC2, MC3, MC4, MC5, MC6, MC7 and MC8. The first to eighth memory cells MC1, MC2, MC3, MC4, MC5, MC6, MC7 and MC8 may include first to eighth selection transistors TR1, TR2, TR3, TR4, TR4, TR5, TR6, TR7 and TR8 and first to eighth resistive memory layers CR1, CR2, CR3, CR4, CR5, CR6, CR7 and CR8.

The first to fourth memory cells MC1, MC2, MC3 and MC4 may be disposed between a first global source line GSL1 and a global drain line GDL, and the fifth to eighth memory cells MC5, MC6, MC7 and MC8 may be disposed between a second global source line GSL2 and the global drain line GDL. When a gate operation voltage of a predetermined threshold voltage or higher is applied to at least one of first to fourth word lines WL1, WL2, WL3 and WL4, at least one of the corresponding first to fourth selection transistors TR1, TR2, TR3 and TR4 may be turned on. The voltage applied to the first to fourth word lines WL1, WL2, WL3 and WL4 may be independently controlled, and thus, only the selected transistor to which the gate operation voltage is applied may be turned on from among the first to fourth selection transistors TR1, TR2, TR3 and TR4. A source-drain voltage between the first global source line GSL1 and the global drain line GDL may be applied to the memory cell in which the selected transistor is turned on. The source-drain voltage may be a write voltage or a read voltage that performs a write operation or a read operation with respect to a corresponding resistive memory layer in the first to fourth resistive memory layers CR1, CR2, CR3, and CR4.

Likewise, when a gate operation voltage of a predetermined threshold voltage or higher is applied to at least one of fifth to eighth word lines WL5, WL6, WL7 and WL8, at least one of the corresponding fifth to eighth selection transistors TR5, TR6, TR7 and TR8 may be turned on. The voltage applied to the fifth to eighth word lines WL5, WL6, WL7 and WL8 may be independently controlled, and thus, only the selected transistor to which the gate operation voltage is applied may be turned on from among the fifth to eighth selection transistors TR5, TR6, TR7 and TR8. A source-drain voltage between the second global source line GSL2 and the global drain line GDL may be applied to the memory cell in which the selected transistor is turned on. The source-drain voltage may be a write voltage or a read voltage that performs a write operation or a read operation with respect to a corresponding resistive memory layer in the fifth to eighth resistive memory layers CR5, CR6, CR7, and CR8.

In some other embodiments, the number of the memory cells disposed between the first global source line GSL1 and the global drain line GDL is not necessarily limited to four, and other various numbers are possible. Accordingly, the number of the memory cells disposed between the second global source line GSL2 and the global drain line GDL is also not necessarily limited to four, and other various numbers are possible.

When comparing FIG. 4 with FIGS. 1 to 3, the first global source line GSL1 may correspond to any one of the first to fourth source electrode layer patterns 122a, 122b, 122c and 122d of the first source electrode structure 12. The global drain line GDL may be any one of the first to fourth drain electrode layer patterns 124a, 124b, 124c and 124d of the drain electrode structure 14. That is, the one of the first to fourth source electrode layer patterns 122a, 122b, 122c and 122d and the one of the first to fourth drain electrode layer patterns 124a, 124b, 124c and 124d may be symmetrically disposed on the same plane around the first channel structure 12 on the same plane.

For example, when the first global source line GSL1 is the fourth source electrode layer pattern 122d, the global drain line GDL may be the fourth drain electrode layer pattern 124d. Similarly, when the first global source line GSL1 is any one of the first to third source electrode layer patterns 122a, 122b and 122c, the global drain line GDL may be any corresponding one of the first to third drain electrode layer patterns 124a, 124b and 124c.

Figure 5:
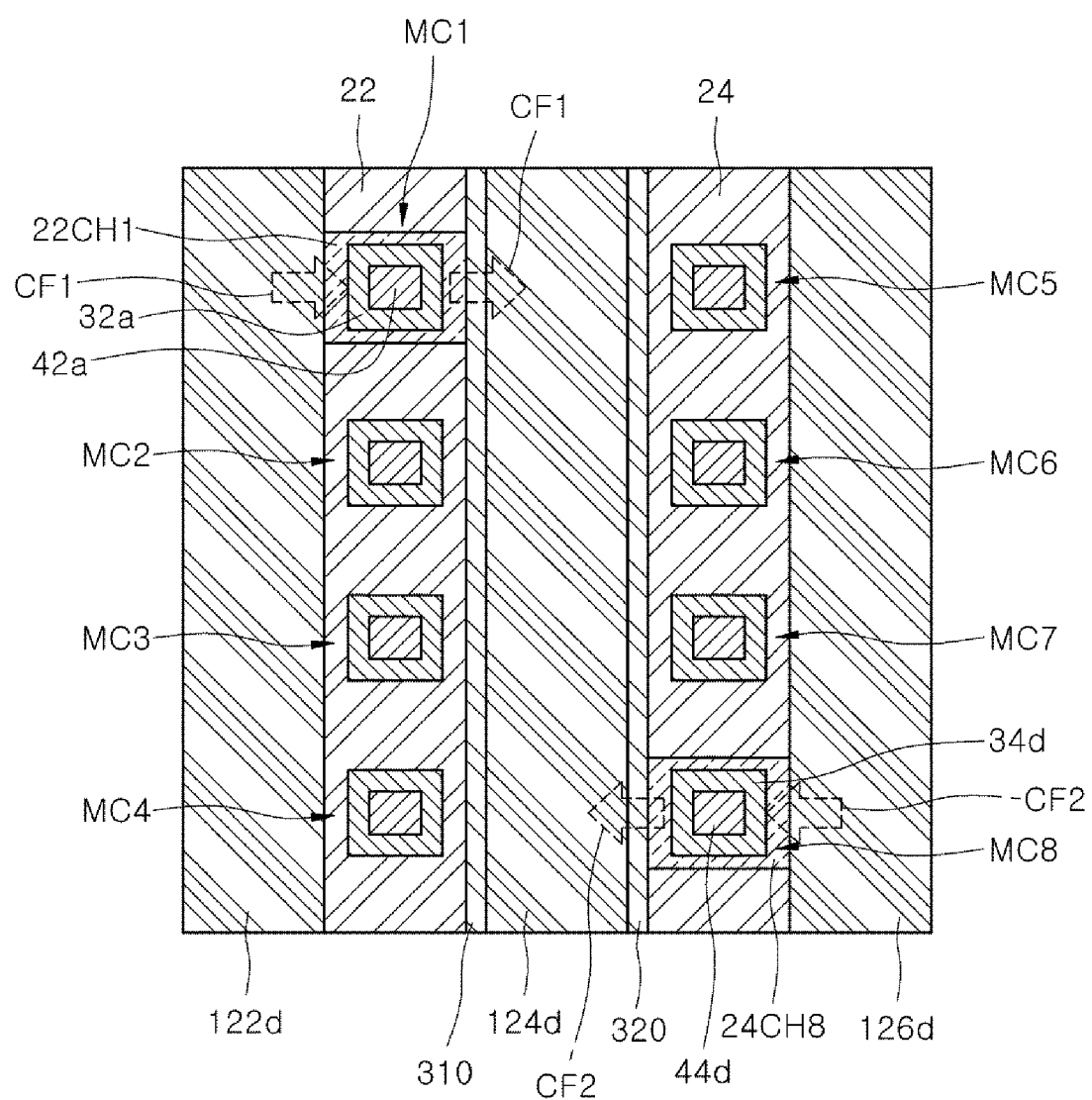
FIG. 5 is a view schematically illustrating a method of driving a nonvolatile memory device according to an embodiment of the present disclosure.

Referring to FIGS. 4 and 5, the first to fourth selection transistors TR1, TR2, TR3 and TR4 may be composed of the first channel structure 22, the first to fourth gate dielectric structures 32a, 32b, 32c and 32d, and the first to fourth gate electrode structures 42a, 42b, 42c and 42d, which are disposed between the first source electrode structure 12 and the drain electrode structure 14 in the nonvolatile memory device 1 related to FIGS. 1 to 3. Here, the first to fourth word lines WL1, WL2, WL3 and WL4 may correspond to the first to fourth gate electrode structures 42a, 42b, 42c and 42d, respectively. The first to fourth resistive memory layers CR1, CR2, CR3 and CR4 may respectively correspond to regions of the first resistance change memory layer 310 which contacts the channel layer regions, as described later with reference to FIG. 5.

In the same manner, the second global source line GSL2 may correspond to any one of the first to fourth source electrode layer patterns 126a, 126b, 126c and 126d of the second source electrode structure 16. The global drain line GDL may correspond to any one of the first to fourth drain electrode layer patterns 124a, 124b, 124c and 124d of the drain electrode structure 14. Here, the one of the first to fourth source electrode layer patterns 126a, 126b, 126c and 126d and the one of the first to fourth drain electrode layer patterns 124a, 124b, 124c and 124d may be symmetrically disposed on the same plane around the second channel structure 24. For example, when the second global source line GSL2 is the fourth source electrode layer pattern 126d, the global drain line GDL may be the fourth drain electrode layer pattern 124d. Similarly, when the second global source line GSL2 is any one of the first to third source electrode layer patterns 126a, 126b and 126c, the global drain line GDL may be any corresponding one of the first to third drain electrode layer patterns 124a, 124b and 124c.

The fifth to eighth selection transistors TR5, TR6, TR7 and TR8 may be composed of the second channel structure 24, the fifth to eighth gate dielectric structures 34a, 34b, 34c and 34d, and the fifth to eighth gate electrode structures 44a, 44b, 44c and 44d, which are disposed between the second source electrode structure 16 and the drain electrode structure 14. Here, the fifth to eighth word lines WL5, WL6, WL7 and WL8 may correspond to the fifth to eighth gate electrode structures 44a, 44b, 44c and 44d, respectively. The fifth to eighth resistive memory layers CR5, CR6, CR7 and CR8 may respectively correspond to regions of the second resistance change memory layer 320 that contacts the channel layer regions, as described later with reference to FIG. 5.

As described above, the first to fourth memory cells MC1, MC2, MC3 and MC4 and the fifth to eighth memory cells MC5, MC6, MC7 and MC8 may share the global drain line GDL. When a selected transistor in at least one memory cell of the first to eighth memory cells MC1, MC2, MC3, MC4, MC5, MC6, MC7 and MC8 is turned on, a predetermined resistance may be written in or read out from a resistance change memory layer in the at least one memory cell, depending on a source-drain operation voltage applied between the first global source line GSL1 or the second global source line GSL2 and the global drain line DSL. As such, according to an embodiment of the present disclosure, random access to any one of the first to eighth memory cells MC1, MC2, MC3, MC4, MC5, MC6, MC7 and MC8 is possible, and a write operation or a read operation may be performed with respect to the randomly accessed memory cell.

FIG. 5 is a view schematically illustrating a method of driving a nonvolatile memory device according to an embodiment of the present disclosure. FIG. 5 is a section of the nonvolatile memory device 1 described above with reference to FIGS. 1 to 3 in a plane perpendicular to the z-direction. FIG. 5 illustrates a fourth source electrode layer pattern 122d of a first source electrode structure 12, a fourth drain electrode layer pattern 124d of a drain electrode structure 14, and a fourth source electrode layer pattern 126d of a second source electrode structure 16 as components for implementing first to eighth memory cells MC1, MC2, MC3, MC4, MC5, MC6, MC7 and MC8 of FIG. 4. FIG. 5 also illustrates the cross-sections of first and second channel structures 22 and 24, first and second resistance change memory layer 310 and 320. Hereinafter, for example, a driving method of the first memory cell MC1 and the eighth memory cell MC8 will be described in detail.

In an embodiment, the first memory cell MC1 may be comprised of the first channel structure 22, a first gate dielectric structure 32a, a first gate electrode structure 42a and a first resistance change memory layer 310, which are disposed between the fourth source electrode layer pattern 122d and the fourth drain electrode layer pattern 124d. In driving the first memory cell MC1, the fourth source electrode layer pattern 122d may be selected among the first to fourth source electrode layer patterns 122a, 122b, 122c and 122d of the first source electrode structure 12. The fourth drain electrode layer pattern 124d of the drain electrode structure 14 corresponding to the fourth source electrode layer pattern 122d may be selected. The fourth source electrode layer pattern 122d and the fourth drain electrode layer pattern 124d may control the first to fourth memory cells MC1, MC2, MC3 and MC4. A source bias and a drain bias having different magnitudes may be applied to the fourth source electrode layer pattern 122d and the fourth drain electrode layer pattern 124d, respectively, so that the fourth source electrode layer pattern 122d and the fourth drain electrode layer pattern 124d may each have a different potential.

Then, a gate operation voltage having a magnitude of a predetermined threshold voltage or greater may be applied to the first gate electrode structure 42a from among the first to fourth gate electrode structures 42a, 42b, 42c and 42d. A channel layer 22CH1 may be formed in a region of the first channel structure 22, adjacent to the first gate dielectric structure 32a, depending on the gate operation voltage. The channel layer 22CH1 may be formed on the base insulation layer 110 in a shape of a pillar or a layer extending in a first direction (i.e., the z-direction) to surround the outer surfaces of the first gate dielectric structure 32a. When the channel layer 22CH1 is formed, a source-drain operation voltage corresponding to a potential difference between the fourth source electrode layer pattern 122d and the fourth drain electrode layer pattern 124d may be mostly applied to the first resistance change memory layer 310 having a relatively high resistance state, rather than applied to the channel layer 22CH1 having a low resistance state. Consequently, when the source-drain operation voltage is applied, charge CF1 may flow between the fourth source electrode layer pattern 122d and the fourth drain electrode layer pattern 124d.

The source-drain operation voltage may perform a write operation or a read operation with respect to the first resistance change memory layer 310. The write operation may be an operation that varies an electrical resistance of a region of the first resistance change memory layer 310 that is in contact with the channel layer 22CH1, depending on a predetermined write voltage. After the write voltage is removed from the first resistance change memory layer 310, the changed resistance may be stored in the region of the first resistance change memory layer 310 in a nonvolatile manner. The read operation may be an operation of reading a resistance of the region of the first resistance change memory layer 310 in contact with the channel layer 22CH1, depending on a predetermined read voltage.

In an embodiment, the resistance change may occur through an operation in which conductive filaments are generated in a region of the first resistance change memory layer 310 in contact with the channel layer 22CH1, or through an operation in which the generated filaments are partially disconnected with respect to the third direction (i.e., the x-direction) when different write voltages are applied to the first resistance change memory layer 310. In another embodiment, the resistance change may occur through an operation in which an insulative thin film is generated in the first resistance change memory layer 310 in contact with the channel layer 22CH1, or through an operation in which the generated insulative thin film is removed, depending on the different write voltage.

In another embodiment, the eighth memory cell MC8 may be comprised of the second channel structure 24 disposed between the fourth source electrode layer pattern 126d and the fourth drain electrode layer pattern 124d, the eighth gate dielectric structure 34d, the eighth gate electrode structure 44d, and the second resistance change memory layer 320. In driving the eighth memory cell MC8, the fourth source electrode layer pattern 126d may be selected from the first to fourth source electrode layer patterns 126a, 126b, 126c, and 126d of the second source electrode structure 16. Thus, the fourth drain electrode layer pattern 124d of the drain electrode structure 14 corresponding to the fourth source electrode layer pattern 126d of the second source electrode structure 16 may be selected. The fourth source electrode layer pattern 126d and the fourth drain electrode layer pattern 124d may control the fifth to eighth memory cells MC5, MC6, MC7 and MC8. A different source bias and drain bias may be applied to the fourth source electrode layer pattern 126d of the second source electrode structure 16 and the fourth drain electrode layer pattern 124d of the drain electrode structure 14, respectively, so that the fourth source electrode layer pattern 126d and the fourth drain electrode layer pattern 124d may have different potentials.

Then, a gate voltage of a predetermined threshold voltage or higher may be applied to the eighth gate electrode structure 44d among the fifth to eighth gate electrode structures 44a, 44b, 44c and 44d. A channel layer 24CH8 may be formed in a region of the second channel structure 24, in contact with the eighth gate dielectric structure 34d, depending on the gate operation voltage. The channel layer 24CH8 may be formed on the base insulation layer 110 in a shape of a pillar or a layer extending in the first direction (i.e., the z-direction) to surround the outer surfaces of eighth gate dielectric structure 34d. When the channel layer 24CH8 is formed, a source-drain operation voltage corresponding to a potential difference between the fourth source electrode layer pattern 126d of the second source electrode structure 16 and the fourth drain electrode layer pattern 124d of the drain electrode structure 14 may be mostly applied to the second resistance change memory layer 320 having a relatively high resistance state, rather than applied to the channel layer 24CH8 having a low resistance state. Accordingly, when the source-drain operation voltage is applied, charge CF2 may flow between the fourth source electrode layer pattern 126d of the second source electrode structure 16 and the fourth drain electrode layer pattern 124d of the drain electrode structure 14.

The source-drain operation voltage may perform a write operation or a read operation on the second resistance change memory layer 320. The write operation may be an operation that varies the electrical resistance with respect to a region of the second resistance change memory layer 320, in contact with the channel layer 24CH8, depending on a predetermined write operation voltage. After the write operation voltage is removed from the second resistance change memory layer 320, the changed resistance may be stored in the region of the second resistance change memory layer 320 in a nonvolatile manner. The read operation may be an operation of reading a resistance with respect to a region of the second resistance change memory layer 320, in contact with the channel layer 24CH8, depending on a predetermined read operation voltage.

In an embodiment, the resistance change may occur via an operation in which conductive filaments are generated in the third direction (i.e., the x-direction), or in which the generated conductive filaments are partially disconnected with respect to the third direction (i.e., the x-direction), in the region of the second resistance change memory layer 320 in contact with the channel layer 24CH8, when different write voltages are applied to the second resistance change memory layer 320. In another embodiment, the resistance change may occur via an operation in which an insulative thin film is generated in the second resistance change memory layer 320 in contact with the channel layer 24CH8, or in which the generated insulative thin film is removed, depending on the different write voltages.

Figure 6:
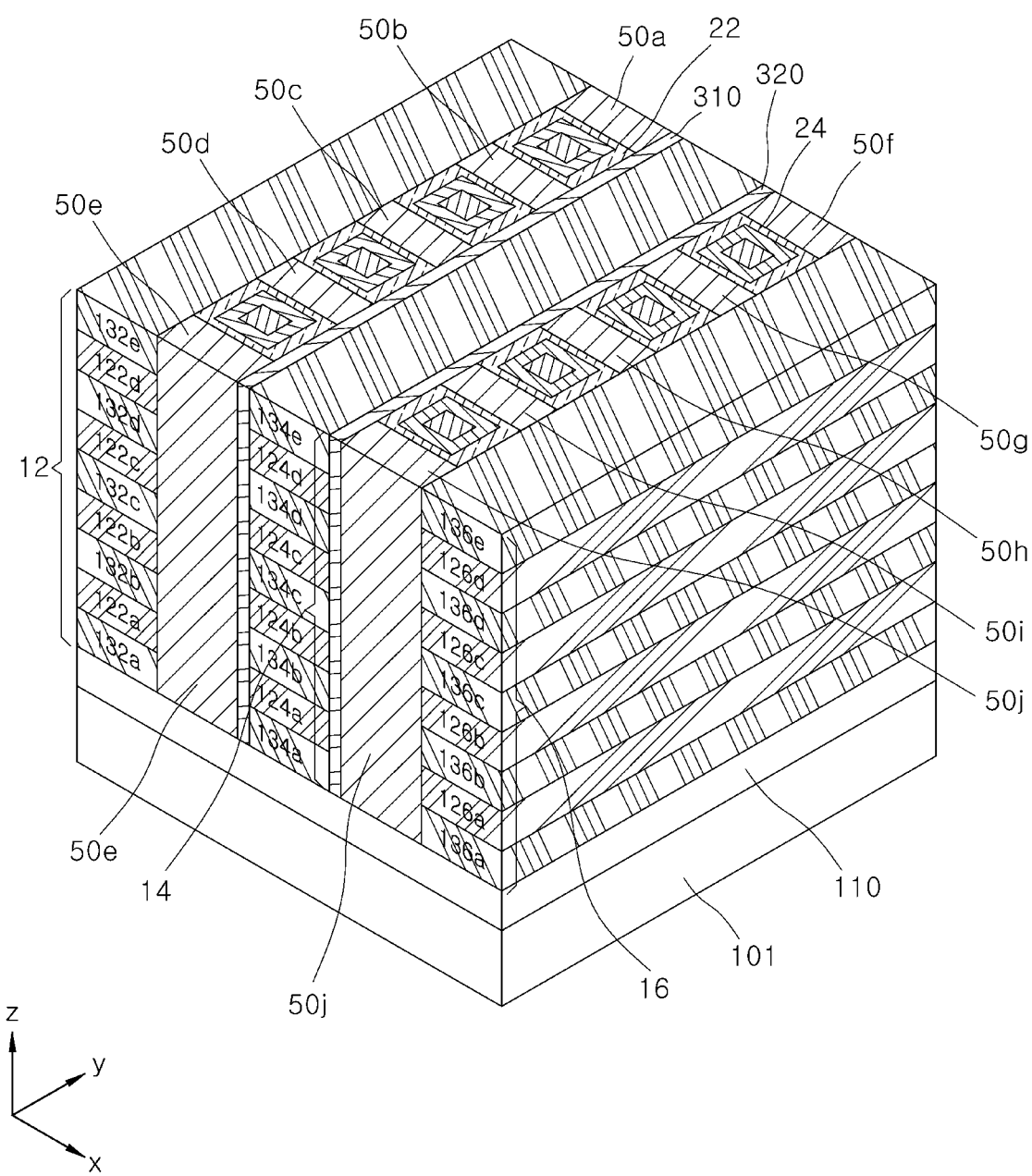
FIG. 6 is a perspective view schematically illustrating a nonvolatile memory device according to another embodiment of the present disclosure.
Figure 7:
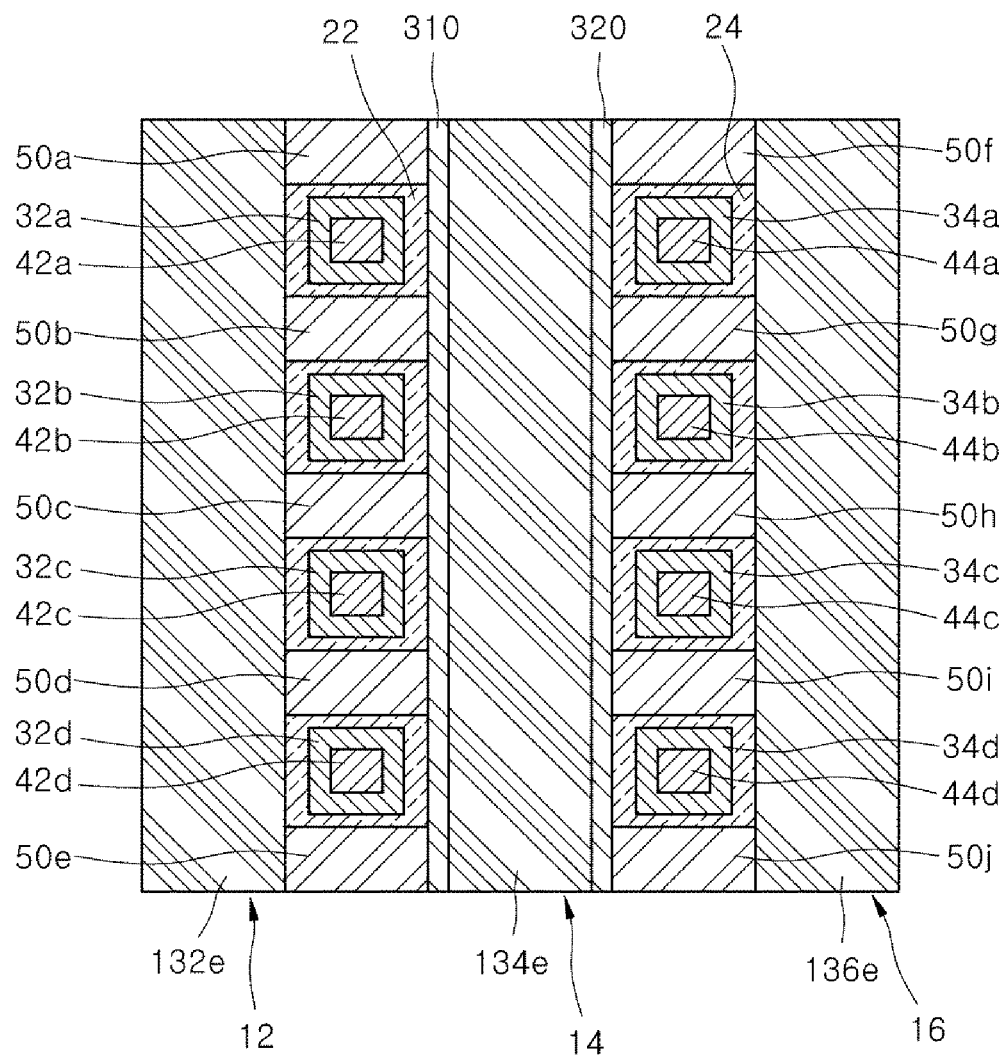
FIG. 7 is a plan view of the nonvolatile memory device of FIG. 6.

FIG. 6 is a perspective view schematically illustrating a nonvolatile memory device according to another embodiment of the present disclosure. FIG. 7 is a plan view of the nonvolatile memory device of FIG. 6.

Referring to FIGS. 6 and 7, in comparison with the nonvolatile memory device 1 of FIGS. 1 to 3, the nonvolatile memory device 2 may further include first to tenth cell insulation structures 50a, 50b, 50c, 50d, 50e, 50f, 50g, 50h, 50i and 50j.

The first to tenth cell insulation structures 50a, 50b, 50c, 50d, 50e, 50f, 50g, 50h, 50i and 50j may be disposed to extend along a first direction (i.e., the z-direction) from a base insulation layer 110. The first to tenth cell insulation structures 50a, 50b, 50c, 50d, 50e, 50f, 50g, 50h, 50i and 50j may be disposed to be spaced apart from each other in first and second channel structures 22 and 24. The first to tenth cell insulation structures 50a, 50b, 50c, 50d, 50e, 50f, 50g, 50h, 50i and 50j may be disposed between neighboring gate dielectric structures 32a, 32b, 32c, 32d, 34a, 34b, 34c and 34d along a second direction (i.e., the y-direction). The first to tenth cell insulation structures 50a, 50b, 50c, 50d, 50e, 50f, 50g, 50h, 50i and 50j may electrically separate the neighboring first and second channel structures 22 and 24 along the second direction (i.e., the y-direction). Accordingly, it is possible to prevent electrical signals from interfering with channel layers of the neighboring channel structures.

In an embodiment, the first to fifth cell insulation structures 50a, 50b, 50c, 50d and 50e may be disposed to contact the first source electrode structure 12 and the first resistance change memory layer 310 in a third direction (i.e., the x-direction). The sixth to tenth cell insulation structures 50f, 50g, 50h, 50i and 50j may be disposed to contact the second source electrode structure 16 and the second resistance change memory layer 320 in a third direction (i.e., the x-direction).

Figure 8:
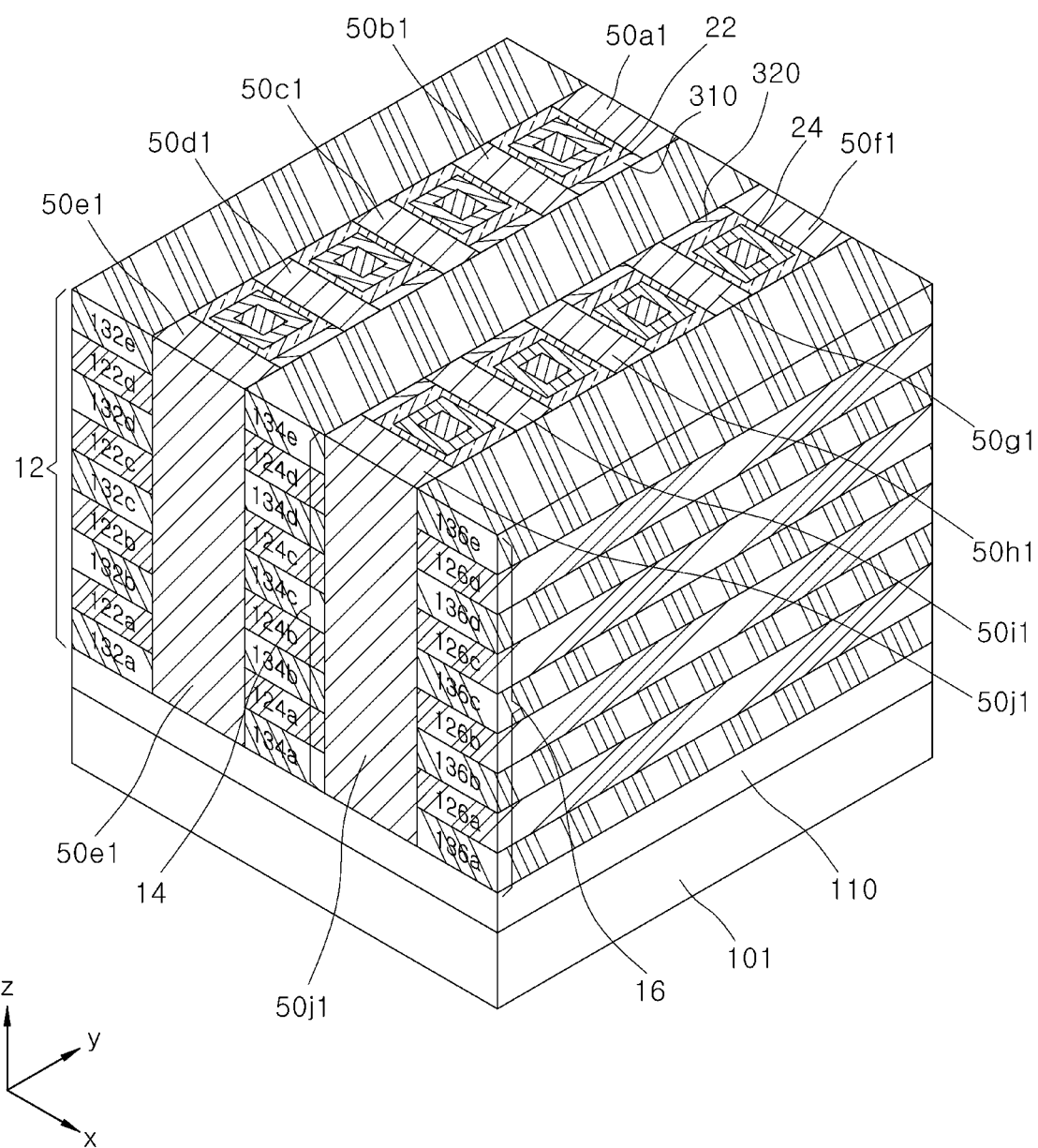
FIG. 8 is a perspective view schematically illustrating a nonvolatile memory device according to yet another embodiment of the present disclosure.
Figure 9:
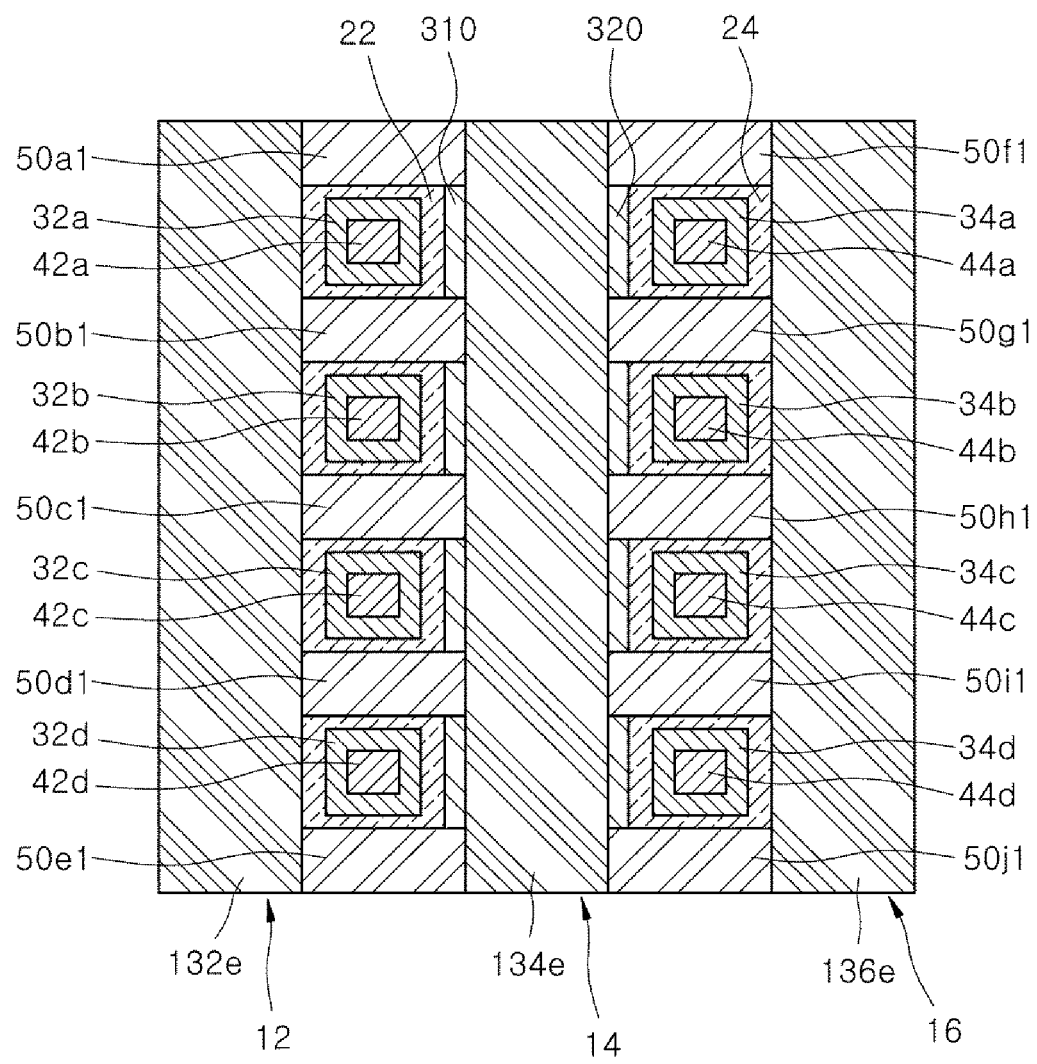
FIG. 9 is a plan view of the nonvolatile memory device of FIG. 8.

FIG. 8 is a perspective view schematically illustrating a nonvolatile memory device according to yet another embodiment of the present disclosure. FIG. 9 is a plan view of the nonvolatile memory device of FIG. 8.

Referring to FIGS. 8 and 9, in comparison with the nonvolatile memory device 2 of FIGS. 6 and 7, the nonvolatile memory device 3 may have a different configuration in first to tenth cell insulation structures 50a1, 50b1, 50c1, 50d1, 50e1, 50f1, 50g1, 50h1, 50i1 and 50j1.

Compared to the first to tenth cell insulation structures 50a, 50b, 50c, 50d, 50e, 50f, 50g, 50h, 50i and 50j illustrated in FIGS. 6 and 7, the first to fifth cell insulation structures 50a1, 50b1, 50c1, 50d1 and 50e1 of the embodiments may extend positively in a third direction (i.e., the x-direction) to directly contact a drain electrode structure 14. Here, in the third direction (i.e., the x-direction), a portion of a first resistance change memory layer 310 between the first to fifth cell insulation structures 50a1, 50b1, 50c1, 50d1 and 50e1 and the drain electrode structure 14 may be removed. In addition, the sixth to tenth cell insulation structures 50f1, 50g1, 50h1, 50i1 and 50j1 of the embodiments may extend negatively in the third direction (i.e., the x-direction) to directly contact the drain electrode structure 14. There, a portion of a second resistance change memory layer 320 between the sixth to tenth cell insulation structures 50f1, 50g1, 50h1, 50i1 and 50j1 and the drain electrode structure 14 may be removed.

The first to tenth cell insulation structures 50a1, 50b1, 50c1, 50d1, 50e1, 50f1, 50g1, 50h1, 50i1 and 50j1 may be disposed to directly contact the drain electrode structure 14 in the x-direction, thereby electrically separating the first and second resistance change memory layers 310 and 320 in a second direction (i.e., the y-direction). Accordingly, electrical signal interference between neighboring memory cells in the second direction can be effectively prevented.

Figure 10:
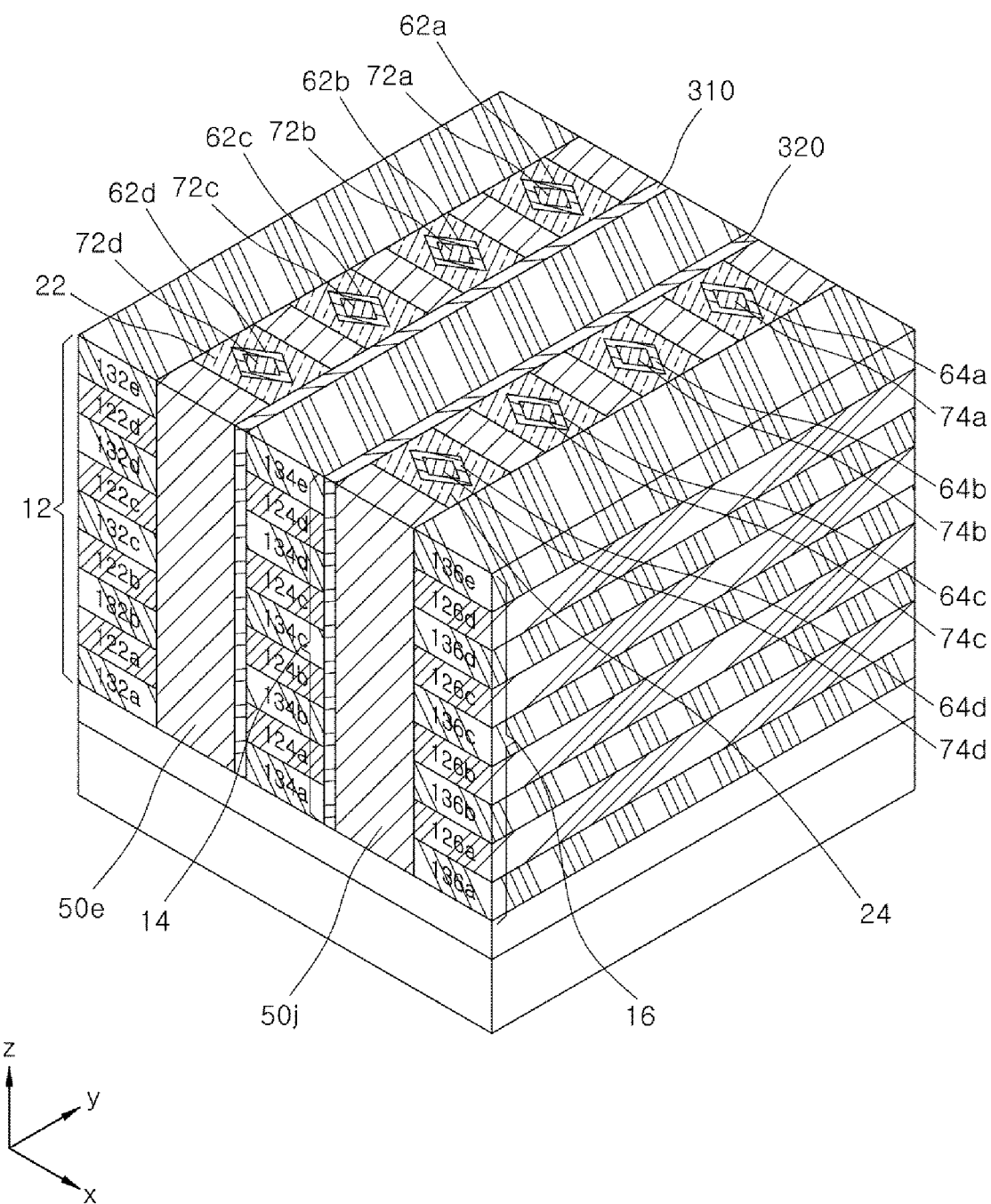
FIG. 10 is a perspective view schematically illustrating a nonvolatile memory device according to still yet another embodiment of the present disclosure.
Figure 11:
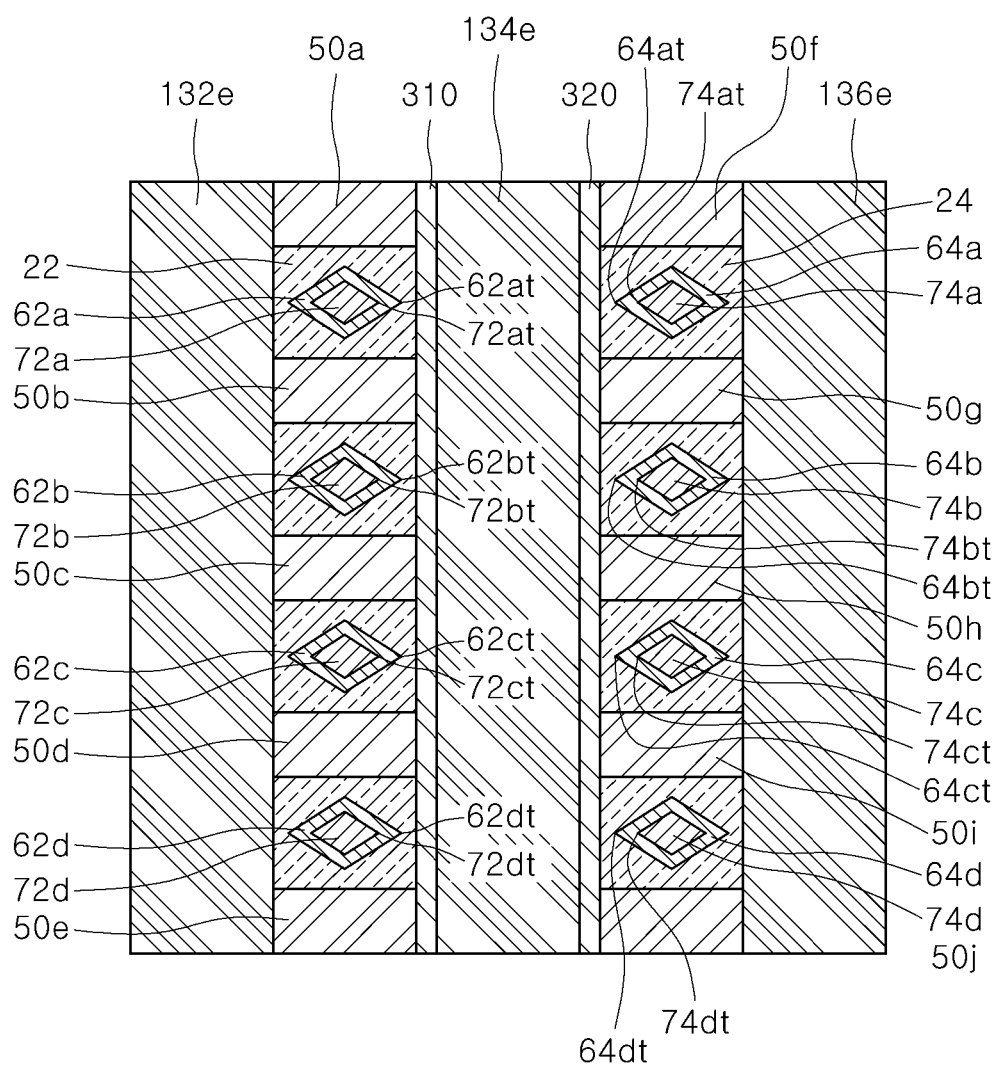
FIG. 11 is a plan view of the nonvolatile memory device of FIG. 10.

FIG. 10 is a perspective view schematically illustrating a nonvolatile memory device according to still yet another embodiment of the present disclosure. FIG. 11 is a plan view of the nonvolatile memory device of FIG. 10.

Referring to FIGS. 10 and 11, in comparison with the nonvolatile memory device 2 of FIGS. 6 and 7, the nonvolatile memory device 4 may include first to eighth gate dielectric structures 62a, 62b, 62c, 62d, 64a, 64b, 64c and 64d and first to eighth gate electrode structures 72a, 72b, 72c, 72d, 74a, 74b, 74c and 74d which have tip portions protruding in the x-direction toward the first and second resistance change memory layers 310 and 320.

The first to eighth gate dielectric structures 62a, 62b, 62c, 62d, 64a, 64b, 64c and 64d and the first to eighth gate electrode structures 72a, 72b, 72c, 72d, 74a, 74b, 74c and 74d may each have a rhombus shape with four vertices on a plane perpendicular to a first direction (i.e., in a horizontal plane). Accordingly, the first to fourth gate dielectric structures 62a, 62b, 62c and 62d may have tip portions 62at, 62bt, 62ct and 62dt protruding toward at least the first resistance change memory layer 310. In addition, the fifth to eighth gate dielectric structures 64a, 64b, 64c and 64d may have tip portions 64at, 64bt, 64ct and 64dt protruding toward at least the second resistance change memory layer 320. Likewise, the first to fourth gate electrode structures 72a, 72b, 72c and 72d may have tip portions 72at, 72bt, 72ct and 72dt protruding toward at least the first resistance change memory layer 310. In addition, the fifth to eighth gate electrode structures 74a, 74b, 74c and 74d may have tip portions 74at, 74bt, 74ct and 74dt protruding toward at least the second resistance change memory layer 320.

The protruding tip portions 72at, 72bt, 72ct, 72dt, 74at, 74bt, 74ct and 74dt of the first to eighth gate electrode structures 72a, 72b, 72c, 72d, 74a, 74b, 74c and 74d, and the protruding tip portions 62at, 62bt, 62ct, 62dt, 64at, 64bt, 64ct and 64dt of the first to eighth gate dielectric structures 62a, 62b, 62c, 62d, 64a, 64b, 64c and 64d, may allow an electric field to be concentrated on the protruding tip portions 62at, 62bt, 62ct, 62dt, 64at, 64bt, 64ct and 64dt when channels are formed in the first and second channel structures 22 and 24, as described above. With a concentrated electric field, resistance change may effectively occur in the first and second resistance change memory layers 310 and 320. For example, conductive filaments may be preferentially generated in the first and second resistance change memory layers 310 and 320 in which the electric field is concentrated, or generated conductive filaments may be effectively disconnected, based on the electric field concentration effect. In another example, nucleation of the insulation layer may occur preferentially in the first and second resistance change memory layers 310 and 320 in which the electric field is concentrated, or removal of the insulation layer may occur first. Thus, it is possible to effectively write and store the signal information via the resistance change.

In some other embodiments not illustrated, a configuration including the first to eighth gate dielectric structures 62a, 62b, 62c, 62d, 64a, 64b, 64c and 64d, and the first to eighth gate electrode structures 72a, 72b, 72c, 72d, 74a, 74b, 74c and 74d that have tip portions protruding toward the first and second resistance change memory layers 310 and 320, may be applied to the nonvolatile memory device 1 (described above with reference to FIGS. 1 to 3), which does not have the first to tenth cell insulation structures 50a, 50b, 50c, 50d, 50e, 50f, 50g, 50h, 50i and 50j.

Figure 12:
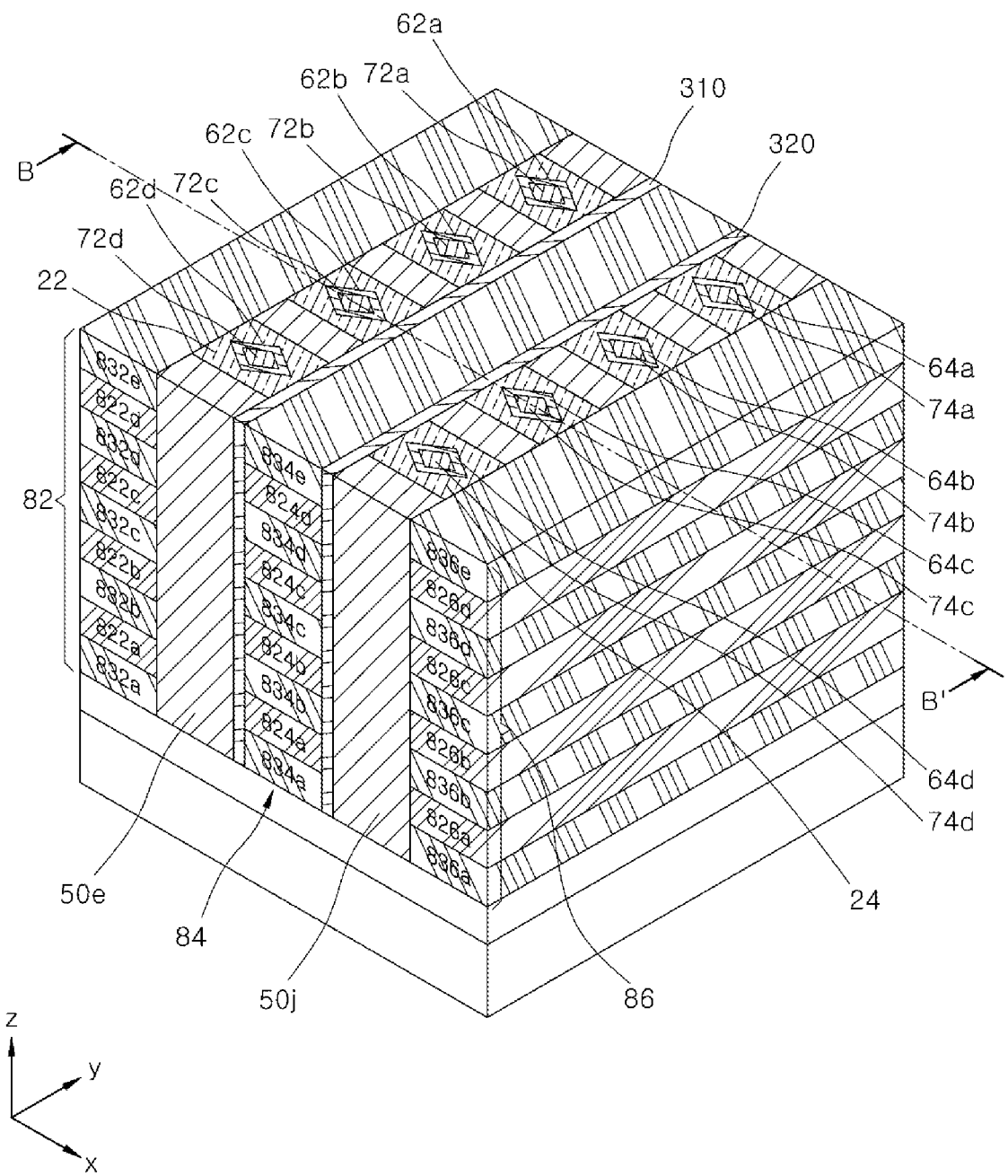
FIG. 12 is a perspective view schematically illustrating a nonvolatile memory device according to still yet another embodiment of the present disclosure.
Figure 13:
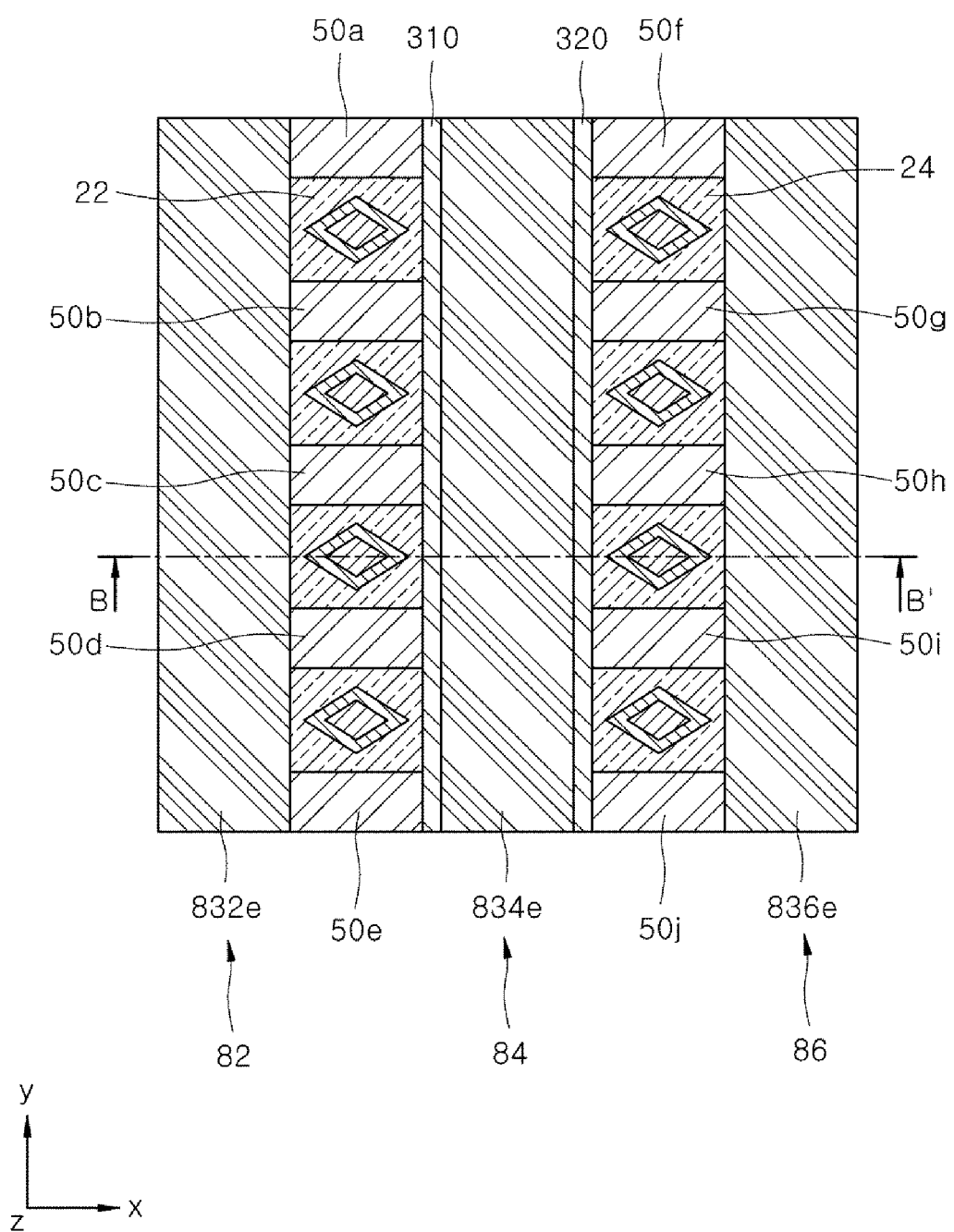
FIG. 13 is a plan view of the nonvolatile memory device of FIG. 12.
Figure 14:
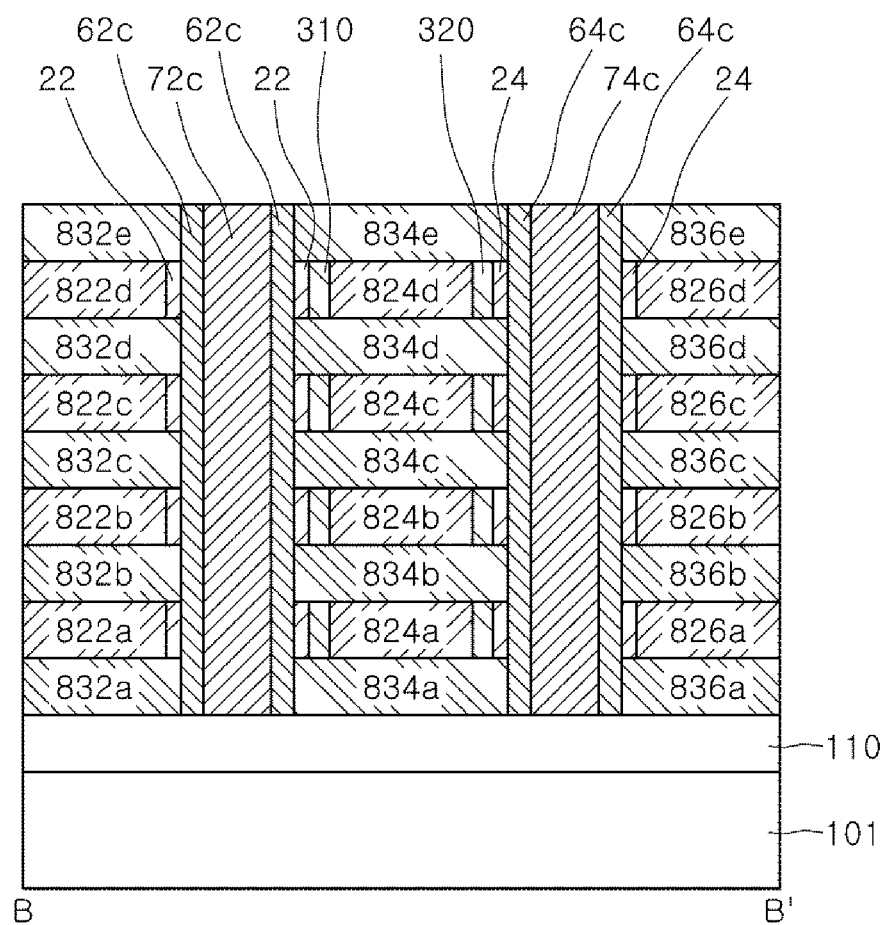
FIG. 14 is a cross-sectional view taken along the line B-B' of the nonvolatile memory device of FIG. 13.

FIG. 12 is a perspective view schematically illustrating a nonvolatile memory device according to still yet another embodiment of the present disclosure. FIG. 13 is a plan view of the nonvolatile memory device of FIG. 12. FIG. 14 is a cross-sectional view taken along the line B-B' of the nonvolatile memory device of FIG. 13.

Referring to FIGS. 12 to 14, the nonvolatile memory device 5 may have a different configuration in first and second source electrode structures 82 and 86 and a drain electrode structure 84, in comparison with the nonvolatile memory device 4 described above with reference to FIGS. 10 and 11.

In some embodiments, the first source electrode structure 82 may include first to fourth source electrode layer patterns 822a, 822b, 822c and 822d and first to fifth source insulation layer patterns 832a, 832b, 832c, 832d and 832e, which are alternately stacked along a first direction (i.e., the z-direction). The second source electrode structure 86 may include first to fourth source electrode layer patterns 826a, 826b, 826c and 826d and first to fifth source insulation layer patterns 836a, 836b, 836c, 836d and 836e, which are alternately stacked along a first direction (i.e., the z-direction). The drain electrode structure 84 may include first to fourth drain electrode layer patterns 824a, 824b, 824c and 824d and first to fifth drain insulation layer patterns 834a, 834b, 834c, 834d and 834e, which are alternately stacked along a first direction (i.e., the z-direction).

Referring to FIGS. 12 to 14, the first to fourth source electrode layer patterns 822a, 822b, 822c and 822d of the first source electrode structure 82 may be disposed to contact the first channel structure 22. In contrast, the first to fifth source insulation layer patterns 832a, 832b, 832c, 832d and 832e may be disposed to contact the first to fourth gate dielectric structures 62a, 62b, 62c and 62d. That is, the first to fifth source insulation layer patterns 832a, 832b, 832c, 832d and 832e, rather than the first to fourth source electrode layer patterns 822a, 822b, 822c and 822d, extend along a third direction (i.e., the x-direction), and the first channel structure 22 is selectively removed, so that the first to fifth source insulation layer patterns 832a, 832b, 832c, 832d and 832e may directly contact the first to fourth gate dielectric structures 62a, 62b, 62c and 62d as illustrated in FIG. 14. In such embodiments, the first to fifth source insulation layer patterns 832a, 832b, 832c, 832d and 832e may more effectively insulate between the first to fourth source electrode layer patterns 822a, 822b, 822c and 822d.

Likewise, the first to fourth source electrode layer patterns 826a, 826b, 826c and 826d of the second source electrode structure 86 may be disposed to contact the second channel structure 24 along a direction opposite to a third direction (i.e., the x-direction). In contrast, the first to fifth source insulation layer patterns 836a, 836b, 836c, 836d and 836e may be disposed to contact the fifth to eighth gate dielectric structures 64a, 64b, 64c and 64d. That is, the first to fifth source insulation layer patterns 836a, 836b, 836c, 836d and 836e extend negatively along the third direction, rather than the first to fourth source electrode layer patterns 826a, 826b, 826c and 826d, and the second channel structure 24 is selectively removed, so that the first to fifth source insulation layer patterns 836a, 836b, 836c, 836d and 836e may contact the fifth to eighth gate dielectric structures 64a, 64b, 64c and 64d directly. In such embodiments, the first to fifth source insulation layer patterns 836a, 836b, 836c, 836d and 836e may more effectively insulate between the first to fourth source electrode layer patterns 826a, 826b, 826c and 826d.

The first to fourth drain electrode layer patterns 824a, 824b, 824c and 824d of the drain electrode structure 84 may extend in a direction opposite to the third direction (i.e., the x-direction) and may be disposed to contact the first and second resistance change memory layers 310 and 320, respectively. In contrast, the first to fifth drain insulation layer patterns 834a, 834b, 834c, 834d and 834e of the drain electrode structure 84 may extend further in the third direction and the opposite direction than the first to fourth drain electrode layer patterns 824a, 824b, 824c and 824d, and may be disposed to directly contact the first to eighth gate dielectric structures 62a, 62b, 62c, 62d, 64a, 64b, 64c and 64d. In such embodiments, the first to fifth drain insulation layer patterns 834a, 834b, 834c, 834d and 834e may more effectively insulate between the first to fourth drain electrode layer patterns 824a, 824b, 824c and 824d.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
   a substrate;
   a source electrode structure disposed on the substrate, the source electrode structure comprising a plurality of source electrode layers and a plurality of source insulation layers that are alternately stacked in a first direction perpendicular to the substrate, wherein the source electrode structure extends in a second direction perpendicular to the first direction,
   a channel structure disposed on the substrate and disposed to contact a sidewall surface of the source electrode structure, the sidewall surface of the source electrode structure being a plane formed by the first and second directions;
   a resistance change memory layer disposed on a sidewall surface of the channel structure on the substrate, the sidewall surface of the channel structure being a plane formed by the first and second directions;
   a drain electrode structure, disposed to contact the resistance change memory layer on the substrate, comprising a plurality of drain electrode layers and a plurality of drain insulation layers that are alternately disposed in the first direction, wherein the drain electrode structure extends in the second direction;
   a plurality of gate dielectric structures extending in the first direction and disposed to be spaced apart from each other in the second direction; and
   a plurality of gate electrode structures disposed to extend in the first direction in the gate dielectric structure,
   wherein the plurality of source electrode layers and the plurality of drain electrode layers are disposed respectively on a plurality different planes that intersect with the plurality of gate electrode structures.

2. The nonvolatile memory device of claim 1, wherein one of the plurality of gate electrode structures is separated from the channel structure by one of the plurality of gate dielectric structures.

3. The nonvolatile memory device of claim 1, wherein the plurality of gate dielectric structures are disposed to be spaced apart from the source electrode structure and the resistance change memory layer in a third direction perpendicular to the first and second directions.

4. The nonvolatile memory device of claim 1, wherein the plurality of gate electrode structures have a pillar shape.

5. The nonvolatile memory device of claim 4, wherein the plurality of gate dielectric structures are disposed to surround the plurality of gate electrode structures on a plane perpendicular to the first direction by a predetermined thickness.

6. The nonvolatile memory device of claim 1, wherein the channel structure is disposed to surround one of the plurality of the gate dielectric structures and one of the plurality of the gate electrode structures.

7. The nonvolatile memory device of claim 1, wherein the plurality of source electrode layers and the plurality of drain electrode layers correspond to each other on the same plane.

8. The nonvolatile memory device of claim 1, wherein the resistance change memory layer comprises oxide having oxygen vacancies.

9. The nonvolatile memory device of claim 8, wherein the oxide comprises at least one selected from the group consisting of silicon oxide, aluminum oxide, tantalum oxide, titanium oxide, and hafnium oxide.

10. The nonvolatile memory device of claim 1, wherein each of the plurality of gate dielectric structures and the plurality of gate electrode structures have a tip portion protruding toward the resistance change memory layer.

11. The nonvolatile memory device of claim 1, wherein the channel structure comprises at least one selected from doped semiconductor, metal oxide, and di-chalcogenide.

12. The nonvolatile memory device of claim 1, further comprising:
cell insulation structures disposed on the substrate along the first direction and between neighboring gate dielectric structures in the second direction.

13. The nonvolatile memory device of claim 12, wherein the cell insulation structures are disposed to contact the source electrode structure and the resistance change memory layer in a third direction perpendicular to the first and second directions.

14. The nonvolatile memory device of claim 1,
wherein the source electrode layer is disposed to contact the channel structure in the third direction,
the drain electrode layer is disposed to contact the resistance change memory layer in the third direction, and
the source and drain insulation layers are disposed to contact the gate dielectric structures in a third direction perpendicular to the first and second directions.

15. A nonvolatile memory device comprising:
a substrate;
a global source line, the global source line comprising a plurality of source electrode layers spaced apart from each other in a first direction perpendicular to the substrate, wherein the plurality of source electrode layers extend in a second direction perpendicular to the first direction;
a channel structure disposed on the substrate to contact the global source line in a third direction perpendicular to the first and second directions;
a resistance change memory layer disposed to contact a sidewall surface of the channel structure in the third direction;
a global drain line disposed to contact the resistance change memory layer in the third direction on the substrate, the global drain line comprising a plurality of drain electrode layers disposed to be spaced apart from each other in the first direction, wherein the plurality of drain electrode layers extend in the second direction;
a plurality of gate dielectric structures extending in the first direction in the channel structure and disposed to be spaced apart from each other in the second direction; and
a plurality of gate electrode structures in the plurality of gate dielectric structures, extending in the first direction,
wherein the channel structure is separated from one of the plurality of gate electrode structures by one of the plurality of the gate dielectric structures,
wherein the plurality of source electrode layers and the plurality of drain electrode layers are disposed respectively on a plurality different planes that intersect with the plurality of gate electrode structures.

16. The nonvolatile memory device of claim 15, wherein the plurality of gate dielectric structures are disposed to be spaced apart from the source electrode structure and the resistance change memory layer in the third direction.

17. The nonvolatile memory device of claim 15, wherein the plurality of gate dielectric structures are disposed to surround the plurality of gate electrode structures on a plane perpendicular to the first direction by a predetermined thickness.

18. The nonvolatile memory device of claim 15, wherein the plurality of source electrode layers and the plurality of drain electrode layers correspond to each other on the same plane.

19. The nonvolatile memory device of claim 15, wherein each of the plurality of gate dielectric structures and each of the plurality of gate electrode structures have a tip portion protruding toward the resistance change memory layer.

20. The nonvolatile memory device of claim 15, further comprising:
cell insulation structures disposed on the substrate in the first direction and between the plurality of gate dielectric structures in the second direction.

21. The nonvolatile memory device of claim 15, wherein the global source line comprises a plurality of source insulation layers insulating the plurality of source electrode layers along the first direction, and
the global drain line comprises a plurality of drain insulation layers insulating the plurality of drain electrode layers along the first direction.

22. The nonvolatile memory device of claim 21,
wherein one of the plurality of source electrode layers is disposed to contact the channel structure in the third direction,
one of the plurality of drain electrode layers is disposed to contact the resistance change memory layer in the third direction, and
the plurality of source and the plurality of drain insulation layers are disposed to contact the plurality of gate dielectric structures in the third direction.

* * * * *